(12) United States Patent
Feldman et al.

(10) Patent No.: US 11,063,204 B2
(45) Date of Patent: Jul. 13, 2021

(54) METHOD OF MANUFACTURE FOR SINGLE CRYSTAL ACOUSTIC RESONATOR DEVICES USING MICRO-VIAS

(71) Applicant: Akoustis, Inc., Huntersville, NC (US)

(72) Inventors: Alexander Y. Feldman, Huntersville, NC (US); Mark D. Boomgarden, Huntersville, NC (US); Michael P. Lewis, Charlotte, NC (US); Jeffrey B. Shealy, Cornelius, NC (US); Ramakrishna Vetury, Charlotte, NC (US)

(73) Assignee: Akoustis, Inc., Huntersville, NC (US)

( * ) Notice: Subject to any disclaimer, the term of this patent is extended or adjusted under 35 U.S.C. 154(b) by 306 days.

(21) Appl. No.: 16/244,996

(22) Filed: Jan. 10, 2019

(65) Prior Publication Data
US 2019/0148621 A1    May 16, 2019

Related U.S. Application Data

(63) Continuation of application No. 15/068,510, filed on Mar. 11, 2016, now Pat. No. 10,217,930.

(51) Int. Cl.
*H01L 41/29* (2013.01)
*H01L 41/047* (2006.01)
(Continued)

(52) U.S. Cl.
CPC .......... *H01L 41/29* (2013.01); *H01L 41/0477* (2013.01); *H01L 41/22* (2013.01);
(Continued)

(58) Field of Classification Search
CPC ............... H03H 3/02; H03H 2003/023; H03H 9/02007; H03H 9/02055; H03H 9/02574;
(Continued)

(56) References Cited

U.S. PATENT DOCUMENTS 5,231,327 A    7/1993  Ketcham
5,894,647 A    4/1999  Lakin
(Continued)

FOREIGN PATENT DOCUMENTS

JP    2009100197 A    5/2009
JP    2010-068109 A   3/2010
(Continued)

OTHER PUBLICATIONS

International Search Report issued in related application No. PCT/US2019/018550 dated May 30, 2019.
(Continued)

*Primary Examiner* — Peter Dungba Vo
*Assistant Examiner* — Joshua D Anderson
(74) *Attorney, Agent, or Firm* — Richard T. Ogawa; Ogawa P.C.

(57) ABSTRACT

A method of manufacture for an acoustic resonator device. The method can include forming a topside metal electrode overlying a piezoelectric substrate with a piezoelectric layer and a seed substrate. A topside micro-trench can be formed within the piezoelectric layer and a topside metal can be formed overlying the topside micro-trench. This topside metal can include a topside metal plug formed within the topside micro-trench. A first backside trench can be formed underlying the topside metal electrode, and a second backside trench can be formed underlying the topside micro-trench. A backside metal electrode can be formed within the first backside trench, while a backside metal plug can be formed within the second backside trench and electrically coupled to the topside metal plug and the backside metal electrode. The topside micro-trench, the topside metal plug, the second backside trench, and the backside metal plug form a micro-via.

17 Claims, 17 Drawing Sheets

(51) Int. Cl.
*H01L 41/332* (2013.01)
*H03H 3/02* (2006.01)
*H03H 9/02* (2006.01)
*H03H 9/17* (2006.01)
*H03H 9/10* (2006.01)
*H03H 9/05* (2006.01)
*H01L 41/22* (2013.01)

(52) U.S. Cl.
CPC ............ *H01L 41/332* (2013.01); *H03H 3/02* (2013.01); *H03H 9/02007* (2013.01); *H03H 9/02055* (2013.01); *H03H 9/02574* (2013.01); *H03H 9/0523* (2013.01); *H03H 9/1007* (2013.01); *H03H 9/174* (2013.01); *H03H 2003/023* (2013.01); *Y10T 29/42* (2015.01)

(58) Field of Classification Search
CPC ........ H03H 9/1007; H03H 9/17; H03H 9/171; H03H 9/174; H03H 9/564; H03H 9/582; H01L 41/0477; H01L 41/22; H01L 41/27; H01L 41/277; H01L 41/29; H01L 41/293; H01L 41/332; Y10T 29/42; Y10T 29/49005
See application file for complete search history.

(56) References Cited

U.S. PATENT DOCUMENTS

| | | | |
|---|---|---|---|
| 6,051,907 A | 4/2000 | Ylilammi | |
| 6,114,635 A | 9/2000 | Lakin et al. | |
| 6,262,637 B1 | 7/2001 | Bradley et al. | |
| 6,377,137 B1 | 4/2002 | Ruby | |
| 6,384,697 B1 | 5/2002 | Ruby | |
| 6,472,954 B1 | 10/2002 | Ruby et al. | |
| 6,617,060 B2 | 9/2003 | Weeks, Jr. et al. | |
| 6,812,619 B1 | 11/2004 | Kaitila et al. | |
| 6,841,922 B2 | 1/2005 | Aigner et al. | |
| 6,864,619 B2 | 3/2005 | Aigner et al. | |
| 6,879,224 B2 | 4/2005 | Frank | |
| 6,909,340 B2 | 6/2005 | Aigner et al. | |
| 6,933,807 B2 | 8/2005 | Marksteiner et al. | |
| 7,112,860 B2 | 9/2006 | Saxler | |
| 7,250,360 B2 | 7/2007 | Shealy et al. | |
| 7,268,436 B2 | 9/2007 | Aigner et al. | |
| 7,365,619 B2 | 4/2008 | Aigner et al. | |
| 7,514,759 B1 | 4/2009 | Mehta et al. | |
| 7,875,910 B2 | 1/2011 | Sheppard et al. | |
| 7,982,363 B2 | 7/2011 | Chitnis | |
| 8,304,271 B2 | 11/2012 | Huang et al. | |
| 2005/0219012 A1 | 10/2005 | Milsom et al. | |
| 2005/0255234 A1 | 11/2005 | Kanda et al. | |
| 2007/0080611 A1 | 4/2007 | Yamada et al. | |
| 2008/0024042 A1 | 1/2008 | Isobe et al. | |
| 2008/0284541 A1 | 11/2008 | Chitnis | |
| 2009/0033177 A1 | 2/2009 | Itaya et al. | |
| 2011/0114968 A1 | 5/2011 | Sheppard et al. | |
| 2011/0298564 A1 | 12/2011 | Iwashita et al. | |
| 2012/0287575 A1 | 11/2012 | Nelson | |
| 2013/0176086 A1 | 7/2013 | Bradley et al. | |
| 2014/0132117 A1 | 5/2014 | Larson, III | |
| 2015/0097638 A1 | 4/2015 | Yu et al. | |
| 2015/0357993 A1 | 12/2015 | Shealy | |
| 2016/0028367 A1 | 1/2016 | Shealy | |
| 2016/0036580 A1 | 2/2016 | Shealy | |
| 2017/0264256 A1 | 9/2017 | Gibb et al. | |
| 2018/0013405 A1 | 1/2018 | Takata | |
| 2018/0054176 A1 | 2/2018 | Kim et al. | |
| 2018/0138885 A1 | 5/2018 | Stokes et al. | |
| 2019/0081611 A1 | 3/2019 | Vetury et al. | |

FOREIGN PATENT DOCUMENTS

| | | |
|---|---|---|
| KR | 20120023285 A | 3/2012 |
| WO | 2005-034349 A1 | 4/2005 |
| WO | 2016122877 A1 | 8/2016 |
| WO | WO2017171856 A1 | 2/2017 |
| WO | WO2017222990 A1 | 12/2017 |

OTHER PUBLICATIONS

International Search Report and Written Opinion for PCT/US2019/040729, dated Oct. 22, 2019.

International Search Report and Written Opinion for PCT/US2019/048412, dated Nov. 19, 2019.

International Search Report for PCT/US2015/034560, dated Sep. 18, 2015.

International Search Report and Written Opinion for PCT/US2020023008 dated Dec. 3, 2020.

International Search Report and Written Opinion for PCT/US2018/050521 dated Jan. 28, 2019.

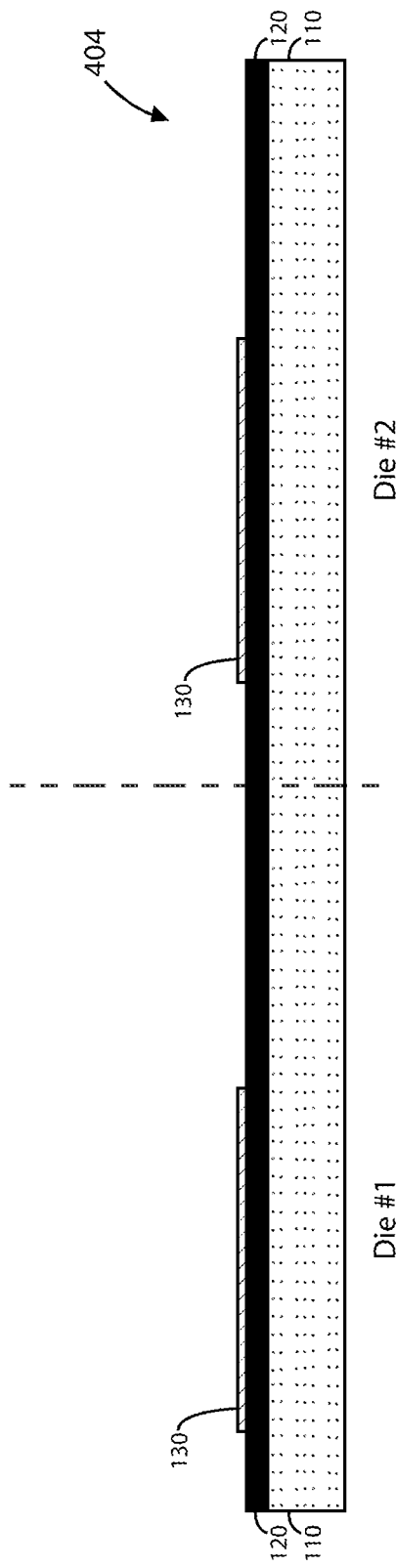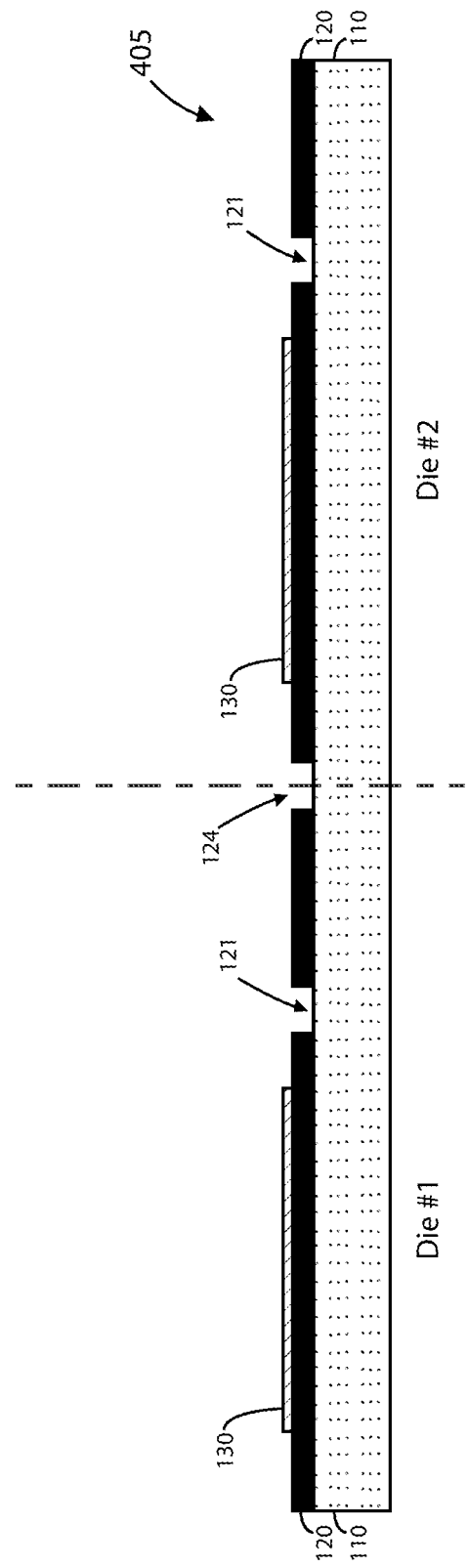

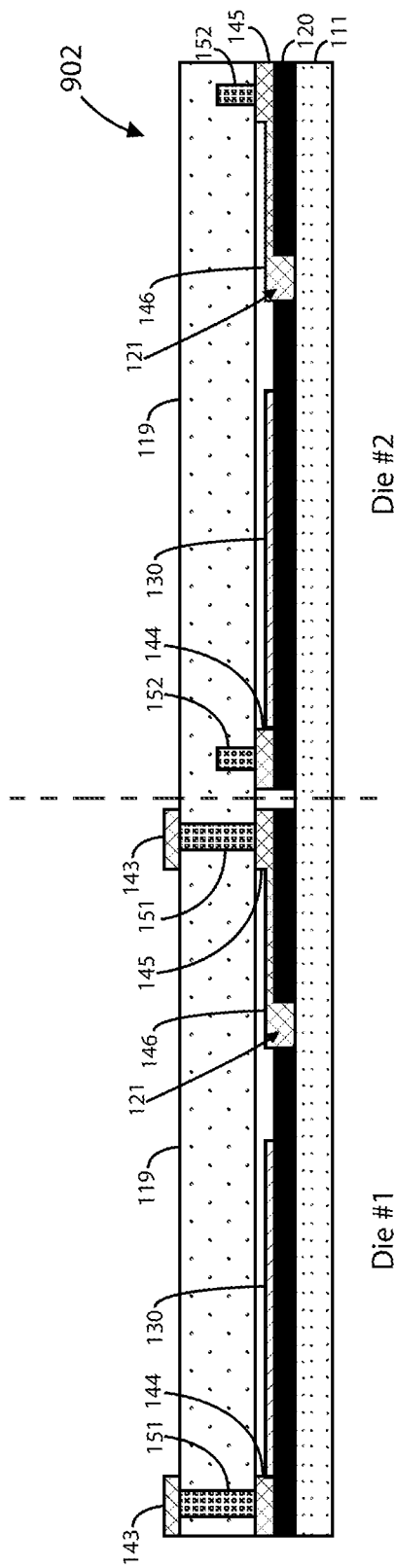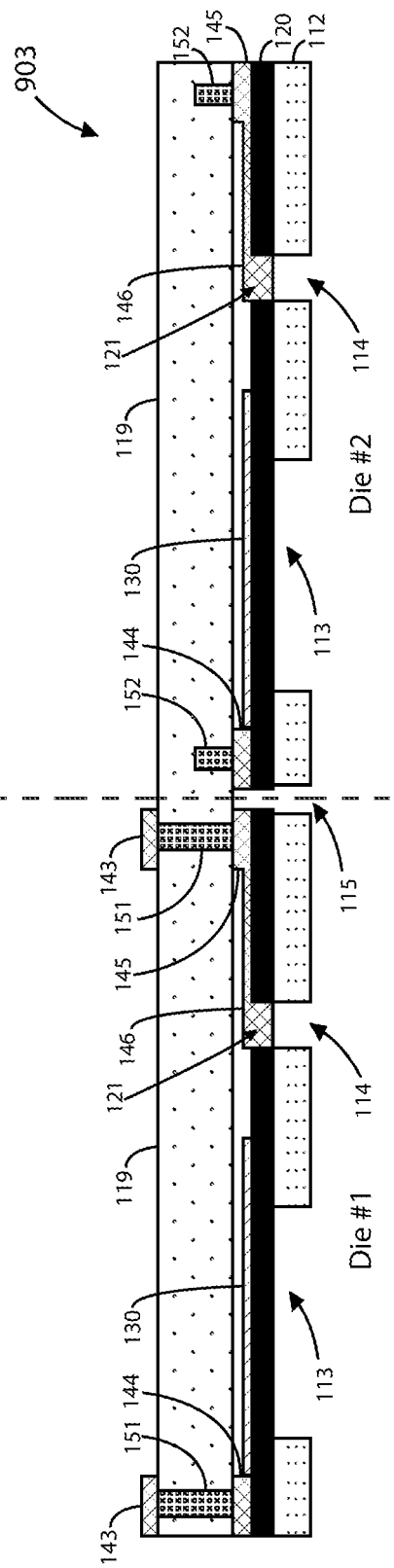

METHOD OF MANUFACTURE FOR SINGLE CRYSTAL ACOUSTIC RESONATOR DEVICES USING MICRO-VIAS

CROSS-REFERENCES TO RELATED APPLICATIONS

The present application is a continuation of U.S. patent application Ser. No. 15/068,510 filed Mar. 11, 2016, and also incorporates by reference, for all purposes, the following concurrently filed patent applications, all commonly owned: U.S. patent application Ser. No. 14/298,057 filed Jun. 2, 2014, now U.S. Pat. No. 9,673,384 issued Jun. 6, 2017, U.S. patent application Ser. No. 14/298,076 filed Jun. 2, 2014, now U.S. Pat. No. 9,537,465 issued Jan. 3, 2017, U.S. patent application Ser. No. 14/298,100 filed Jun. 2, 2014, now U.S. Pat. No. 9,571,061 issued Feb. 14, 2017, U.S. patent application Ser. No. 14/341,314 filed Jul. 25, 2014, now U.S. Pat. No. 9,805,966 issued Oct. 31, 2017, U.S. patent application Ser. No. 14/449,001 filed Jul. 31, 2014, now U.S. Pat. No. 9,716,581 issued Jul. 25, 2017, and U.S. patent application Ser. No. 14/469,503 filed Aug. 26, 2014, now U.S. Pat. No. 9,917,568 issued Mar. 13, 2018.

BACKGROUND OF THE INVENTION

The present invention relates generally to electronic devices. More particularly, the present invention provides techniques related to a method of manufacture for bulk acoustic wave resonator devices, single crystal bulk acoustic wave resonator devices, single crystal filter and resonator devices, and the like. Merely by way of example, the invention has been applied to a single crystal resonator device for a communication device, mobile device, computing device, among others.

Mobile telecommunication devices have been successfully deployed world-wide. Over a billion mobile devices, including cell phones and smartphones, were manufactured in a single year and unit volume continues to increase year-over-year. With ramp of 4G/LTE in about 2012, and explosion of mobile data traffic, data rich content is driving the growth of the smartphone segment—which is expected to reach 2B per annum within the next few years. Coexistence of new and legacy standards and thirst for higher data rate requirements is driving RF complexity in smartphones. Unfortunately, limitations exist with conventional RF technology that is problematic, and may lead to drawbacks in the future.

From the above, it is seen that techniques for improving electronic devices are highly desirable.

BRIEF SUMMARY OF THE INVENTION

According to the present invention, techniques generally related to electronic devices are provided. More particularly, the present invention provides techniques related to a method of manufacture for bulk acoustic wave resonator devices, single crystal resonator devices, single crystal filter and resonator devices, and the like. Merely by way of example, the invention has been applied to a single crystal resonator device for a communication device, mobile device, computing device, among others.

In an example, the present invention provides a method for fabricating a bulk acoustic wave resonator device. This method can include providing a piezoelectric substrate having a substrate surface region. This piezo electric substrate can have a piezoelectric layer formed overlying a seed substrate. A topside metal electrode can be formed overlying a portion of the substrate surface region. The method can include forming a topside micro-trench within a portion of the piezoelectric layer and forming one or more bond pads overlying one or more portions of the piezoelectric layer. A topside metal can be formed overlying a portion of the piezoelectric layer. This topside metal can include a topside metal plug, or a bottom side metal plug, formed within the topside micro-trench and electrically coupled to at least one of the bond pads.

In an example, the method can include thinning the seed substrate to form a thinned seed substrate. A first backside trench can be formed within the thinned seed substrate and underlying the topside metal electrode. A second backside trench can be formed within the thinned seed substrate and underlying the topside micro-trench. Also, the method includes forming a backside metal electrode underlying one or more portions of the thinned seed substrate, within the first backside trench, and underlying the topside metal electrode; and forming a backside metal plug underlying one or more portions of the thinned substrate, within the second backside trench, and underlying the topside micro-trench. The backside metal plug can be electrically coupled to the topside metal plug and the backside metal electrode. The topside micro-trench, the topside metal plug, the second backside trench, and the backside metal plug form a micro-via. In a specific example, both backside trenches can be combined in one trench, where the shared backside trench can include the backside metal electrode underlying the topside metal electrode and the backside metal plug underlying the topside micro-trench.

In an example, the method can include providing a top cap structure, wherein the top cap structure including an interposer substrate with one or more through-via structures electrically coupled to one or more top bond pads and one or more bottom bond pads. The top cap structure can be bonded to the piezoelectric substrate, while the one or more bottom bond pads can be electrically coupled to the one or more bond pads and the topside metal. A backside cap structure can be bonded to the thinned seed substrate such that the backside cap structure is configured underlying the first and second backside trenches, and one or more solder balls formed overlying the one or more top bond pads.

In an alternative example, the method can include providing a top cap structure, wherein the top cap structure including an interposer substrate with one or more blind via structures electrically coupled to one or more bottom bond pads. The top cap structure can be bonded to the piezoelectric substrate, while the one or more bottom bond pads are electrically coupled to the one or more bond pads and the topside metal. The method can include thinning the top cap structure to expose the one or more blind vias. One or more top bond pads can be formed overlying and electrically coupled to the one or more blind vias, and one or more solder balls can be formed overlying the one or more top bond pads.

In an alternative example, the method can include providing a top cap structure, wherein the top cap structure including a substrate with one or more bottom bond pads. The top cap structure can be bonded to the piezoelectric substrate, while the one or more bottom bond pads are electrically coupled to the one or more bond pads and the topside metal. A backside cap structure can be bonded to the thinned seed substrate such that the backside cap structure is configured underlying the first and second backside trenches. The method can include forming one or more backside bond pads within one or more portions of the backside cap structure. These one or more of the backside bond pads can be electrically coupled to the backside metal plug. One or more solder balls can be formed underlying the one or more backside bond pads.

In an alternative example, the present invention can provide a method for fabricating a top cap or bottom cap free structure, wherein the thinned device is assembled into the final package on the die level. Compared to the examples previously described, the top cap or bottom cap free structure may omit the steps of bonding a top cap structure to the piezoelectric substrate or the steps of bonding a backside cap structure to the thinned substrate.

One or more benefits are achieved over pre-existing techniques using the invention. In particular, the present device can be manufactured in a relatively simple and cost effective manner while using conventional materials and/or methods according to one of ordinary skill in the art. Using the present method, one can create a reliable single crystal based acoustic filter or resonator using multiple ways of three-dimensional stacking through a wafer level process. Such filters or resonators can be implemented in an RF filter device, an RF filter system, or the like. Depending upon the embodiment, one or more of these benefits may be achieved.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIGS. 4D and 4E are simplified diagrams illustrating an alternative method for conducting the method step of forming a topside micro-trench as described in FIG. 4A.

FIGS. 9B and 9C are simplified diagrams illustrating an alternative method for conducting the method step of forming backside trenches, as described in FIG. 9A, and simultaneously singulating a seed substrate according to an embodiment of the present invention.

DETAILED DESCRIPTION OF THE INVENTION

According to the present invention, techniques generally related to electronic devices are provided. More particularly, the present invention provides techniques related to a single crystal acoustic resonator using wafer level technologies. Merely by way of example, the invention has been applied to a resonator device for a communication device, mobile device, computing device, among others.

Figure 1A:
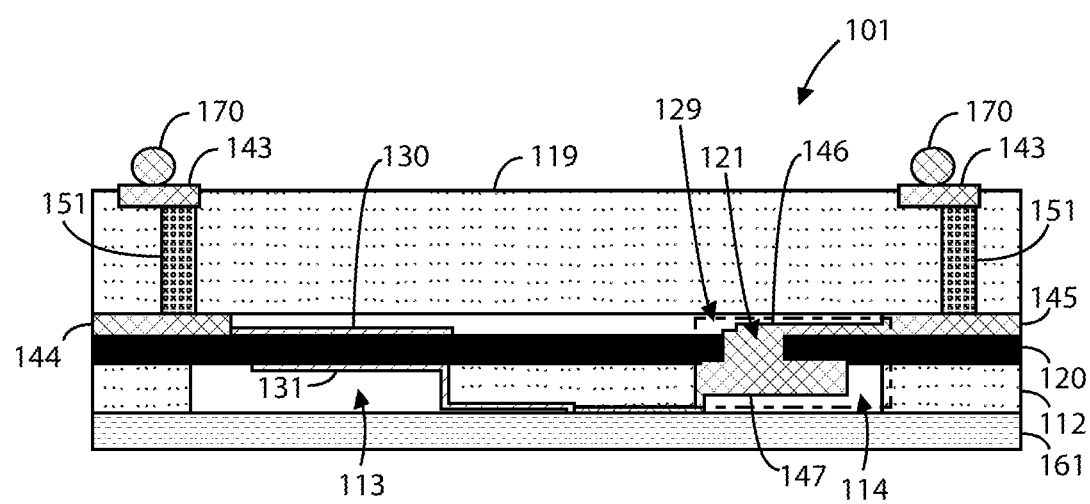
FIG. 1A is a simplified diagram illustrating an acoustic resonator device having topside interconnections according to an example of the present invention.

FIG. 1A is a simplified diagram illustrating an acoustic resonator device 101 having topside interconnections according to an example of the present invention. As shown, device 101 includes a thinned seed substrate 112 with an overlying single crystal piezoelectric layer 120, which has a micro-via 129. The micro-via 129 can include a topside micro-trench 121, a topside metal plug 146, a backside trench 114, and a backside metal plug 147. Although device 101 is depicted with a single micro-via 129, device 101 may have multiple micro-vias. A topside metal electrode 130 is formed overlying the piezoelectric layer 120. A top cap structure is bonded to the piezoelectric layer 120. This top cap structure includes an interposer substrate 119 with one or more through-vias 151 that are connected to one or more top bond pads 143, one or more bond pads 144, and topside metal 145 with topside metal plug 146. Solder balls 170 are electrically coupled to the one or more top bond pads 143.

The thinned substrate 112 has the first and second backside trenches 113, 114. A backside metal electrode 131 is formed underlying a portion of the thinned seed substrate 112, the first backside trench 113, and the topside metal electrode 130. The backside metal plug 147 is formed underlying a portion of the thinned seed substrate 112, the second backside trench 114, and the topside metal 145. This backside metal plug 147 is electrically coupled to the topside metal plug 146 and the backside metal electrode 131. A backside cap structure 161 is bonded to the thinned seed substrate 112, underlying the first and second backside trenches 113, 114. Further details relating to the method of manufacture of this device will be discussed starting from FIG. 2.

Figure 1B:
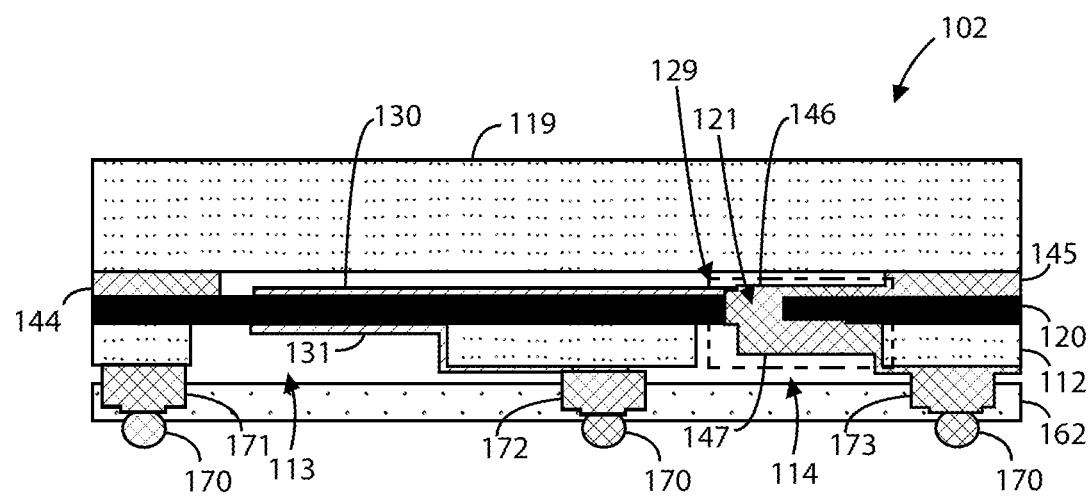
FIG. 1B is a simplified diagram illustrating an acoustic resonator device having bottom-side interconnections according to an example of the present invention.

FIG. 1B is a simplified diagram illustrating an acoustic resonator device 102 having backside interconnections according to an example of the present invention. As shown, device 101 includes a thinned seed substrate 112 with an overlying piezoelectric layer 120, which has a micro-via 129. The micro-via 129 can include a topside micro-trench 121, a topside metal plug 146, a backside trench 114, and a backside metal plug 147. Although device 102 is depicted with a single micro-via 129, device 102 may have multiple micro-vias. A topside metal electrode 130 is formed overlying the piezoelectric layer 120. A top cap structure is bonded to the piezoelectric layer 120. This top cap structure 119 includes bond pads which are connected to one or more bond pads 144 and topside metal 145 on piezoelectric layer 120. The topside metal 145 includes a topside metal plug 146.

The thinned substrate 112 has the first and second backside trenches 113, 114. A backside metal electrode 131 is formed underlying a portion of the thinned seed substrate 112, the first backside trench 113, and the topside metal electrode 130. A backside metal plug 147 is formed underlying a portion of the thinned seed substrate 112, the second backside trench 114, and the topside metal plug 146. This backside metal plug 147 is electrically coupled to the topside metal plug 146. A backside cap structure 162 is bonded to the thinned seed substrate 112, underlying the first and second backside trenches. One or more backside bond pads (171, 172, 173) are formed within one or more portions of the backside cap structure 162. Solder balls 170 are electrically coupled to the one or more backside bond pads 171-173. Further details relating to the method of manufacture of this device will be discussed starting from FIG. 14A.

Figure 1C:
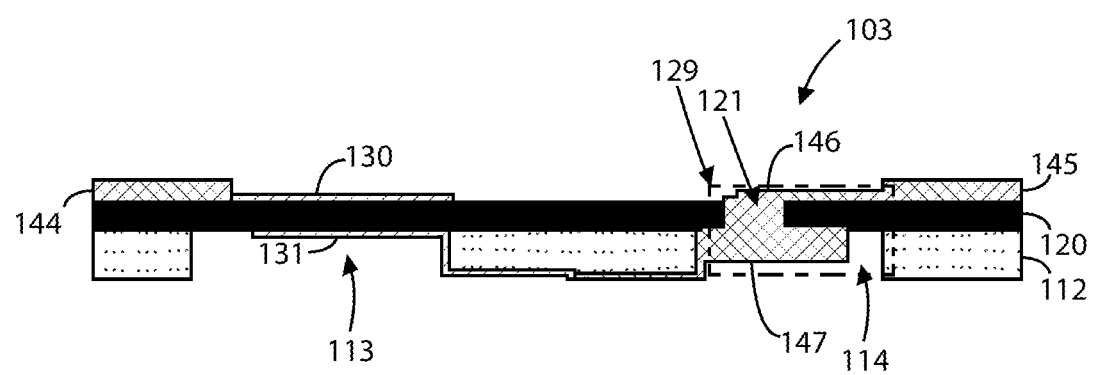
FIG. 1C is a simplified diagram illustrating an acoustic resonator device having interposer/cap-free structure interconnections according to an example of the present invention.

FIG. 1C is a simplified diagram illustrating an acoustic resonator device having interposer/cap-free structure interconnections according to an example of the present invention. As shown, device 103 includes a thinned seed substrate 112 with an overlying single crystal piezoelectric layer 120, which has a micro-via 129. The micro-via 129 can include a topside micro-trench 121, a topside metal plug 146, a backside trench 114, and a backside metal plug 147. Although device 103 is depicted with a single micro-via 129, device 103 may have multiple micro-vias. A topside metal electrode 130 is formed overlying the piezoelectric layer 120. The thinned substrate 112 has the first and second backside trenches 113, 114. A backside metal electrode 131 is formed underlying a portion of the thinned seed substrate 112, the first backside trench 113, and the topside metal electrode 130. A backside metal plug 147 is formed underlying a portion of the thinned seed substrate 112, the second backside trench 114, and the topside metal 145. This backside metal plug 147 is electrically coupled to the topside metal plug 146 and the backside metal electrode 131. Further details relating to the method of manufacture of this device will be discussed starting from FIG. 2.

Figure 1D:
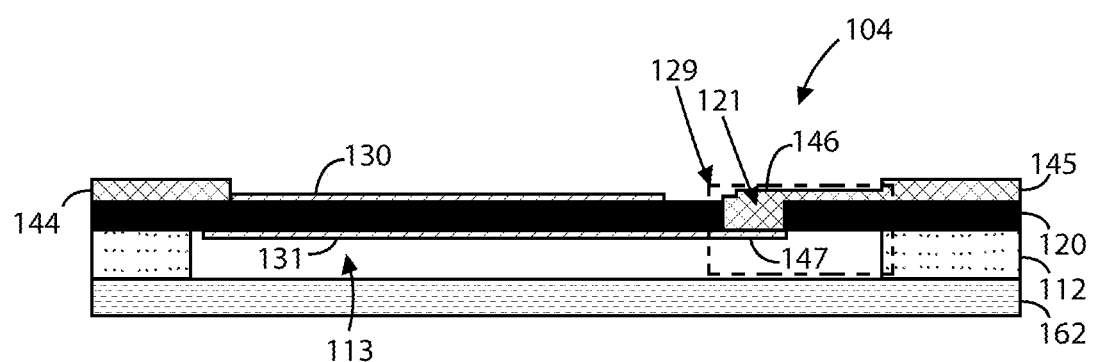
FIG. 1D is a simplified diagram illustrating an acoustic resonator device having interposer/cap-free structure interconnections with a shared backside trench according to an example of the present invention.

FIG. 1D is a simplified diagram illustrating an acoustic resonator device having interposer/cap-free structure interconnections with a shared backside trench according to an example of the present invention. As shown, device 104 includes a thinned seed substrate 112 with an overlying single crystal piezoelectric layer 120, which has a micro-via 129. The micro-via 129 can include a topside micro-trench 121, a topside metal plug 146, and a backside metal 147. Although device 104 is depicted with a single micro-via 129, device 104 may have multiple micro-vias. A topside metal electrode 130 is formed overlying the piezoelectric layer 120. The thinned substrate 112 has a first backside trench 113. A backside metal electrode 131 is formed underlying a portion of the thinned seed substrate 112, the first backside trench 113, and the topside metal electrode 130. A backside metal 147 is formed underlying a portion of the thinned seed substrate 112, the second backside trench 114, and the topside metal 145. This backside metal 147 is electrically coupled to the topside metal plug 146 and the backside metal electrode 131. Further details relating to the method of manufacture of this device will be discussed starting from FIG. 2.

Figure 2:
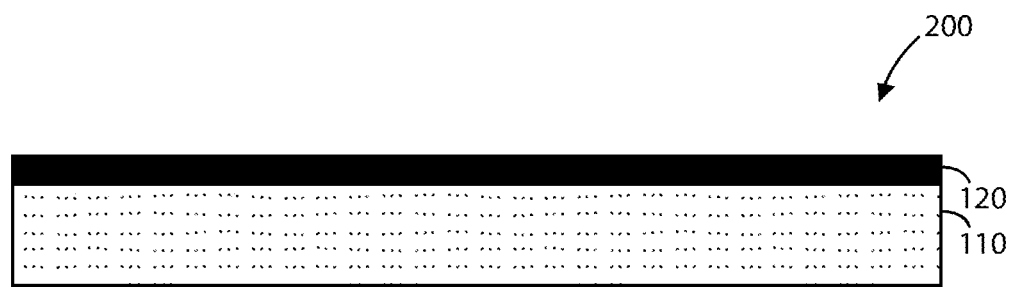
FIGS. 2 and 3 are simplified diagrams illustrating steps for a method of manufacture for an acoustic resonator device according to an example of the present invention.
Figure 3:
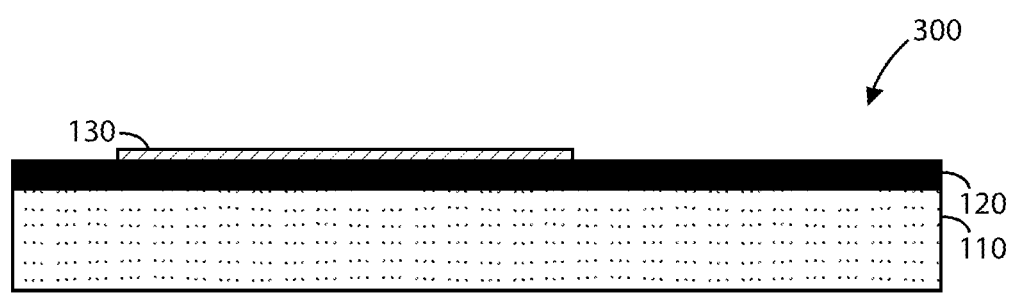

FIGS. 2 and 3 are simplified diagrams illustrating steps for a method of manufacture for an acoustic resonator device according to an example of the present invention. This method illustrates the process for fabricating an acoustic resonator device similar to that shown in FIG. 1A. FIG. 2 can represent a method step of providing a partially processed piezoelectric substrate. As shown, device 102 includes a seed substrate 110 with a piezoelectric layer 120 formed overlying. In a specific example, the seed substrate can include silicon, silicon carbide, aluminum oxide, or single crystal aluminum gallium nitride materials, or the like. The piezoelectric layer 120 can include a piezoelectric single crystal layer or a thin film piezoelectric single crystal layer.

FIG. 3 can represent a method step of forming a top side metallization or top resonator metal electrode 130. In a specific example, the topside metal electrode 130 can include a molybdenum, aluminum, ruthenium, or titanium material, or the like and combinations thereof. This layer can be deposited and patterned on top of the piezoelectric layer by a lift-off process, a wet etching process, a dry etching process, a metal printing process, a metal laminating process, or the like. The lift-off process can include a sequential process of lithographic patterning, metal deposition, and lift-off steps to produce the topside metal layer. The wet/dry etching processes can includes sequential processes of metal deposition, lithographic patterning, metal deposition, and metal etching steps to produce the topside metal layer. Those of ordinary skill in the art will recognize other variations, modifications, and alternatives.

Figure 4A:
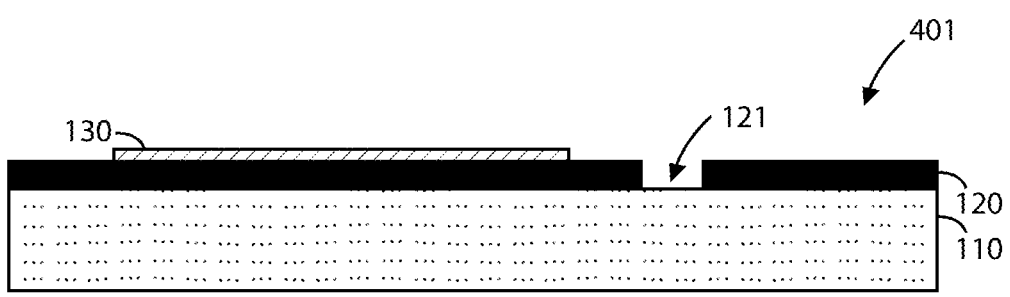
FIG. 4A is a simplified diagram illustrating a step for a method creating a topside micro-trench according to an example of the present invention.
Figure 4B:
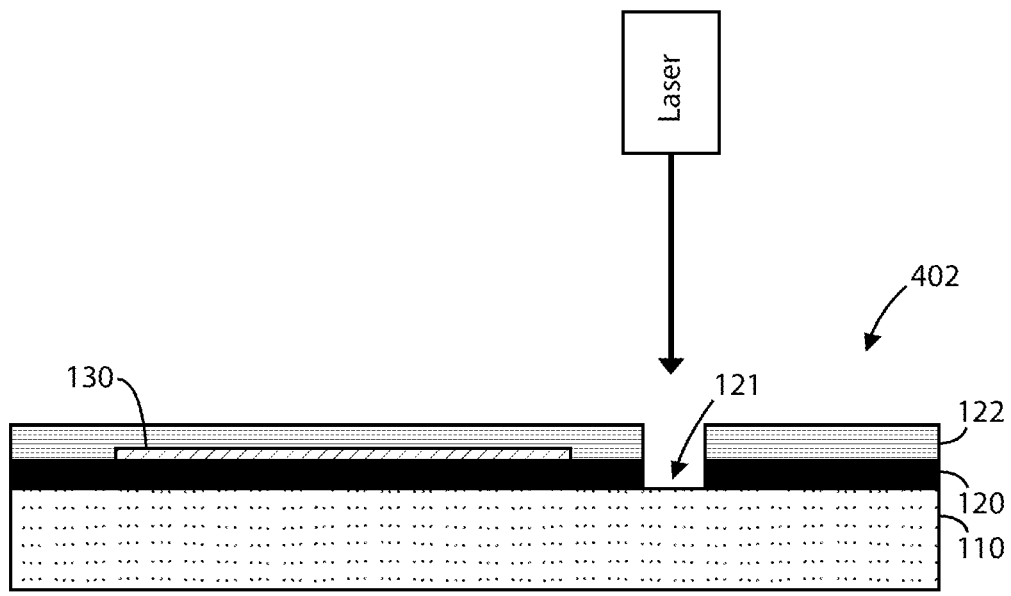
FIGS. 4B and 4C are simplified diagrams illustrating alternative methods for conducting the method step of forming a topside micro-trench as described in FIG. 4A.
Figure 4C:
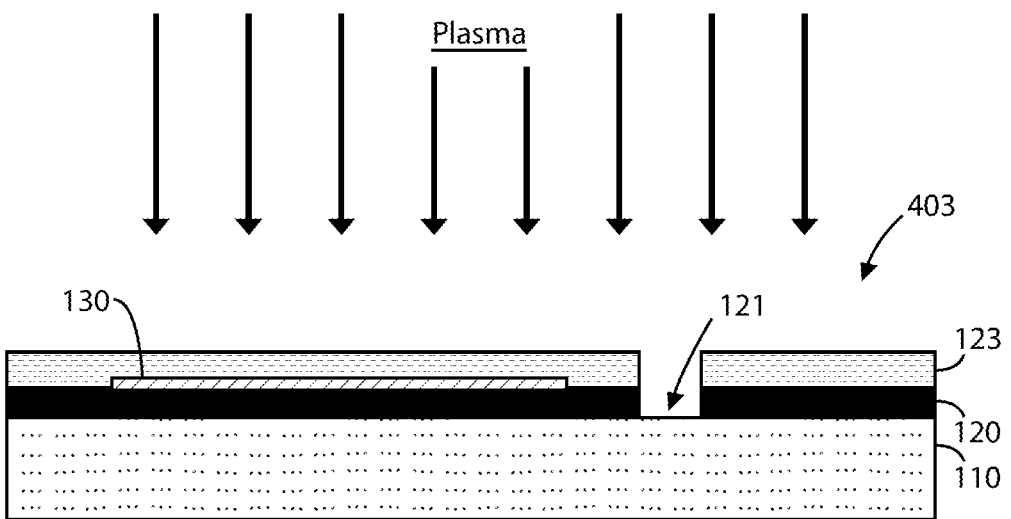

FIG. 4A is a simplified diagram illustrating a step for a method of manufacture for an acoustic resonator device 401 according to an example of the present invention. This figure can represent a method step of forming one or more topside micro-trenches 121 within a portion of the piezoelectric layer 120. This topside micro-trench 121 can serve as the main interconnect junction between the top and bottom sides of the acoustic membrane, which will be developed in later method steps. In an example, the topside micro-trench 121 is extends all the way through the piezoelectric layer 120 and stops in the seed substrate 110. This topside micro-trench 121 can be formed through a dry etching process, a laser drilling process, or the like. FIGS. 4B and 4C describe these options in more detail.

FIGS. 4B and 4C are simplified diagrams illustrating alternative methods for conducting the method step as described in FIG. 4A. As shown, FIG. 4B represents a method step of using a laser drill, which can quickly and accurately form the topside micro-trench 121 in the piezoelectric layer 120. In an example, the laser drill can be used to form nominal 50 um holes, or holes between 10 um and 500 um in diameter, through the piezoelectric layer 120 and stop in the seed substrate 110 below the interface between layers 120 and 110. A protective layer 122 can be formed overlying the piezoelectric layer 120 and the topside metal electrode 130. This protective layer 122 can serve to protect the device from laser debris and to provide a mask for the etching of the topside micro-via 121. In a specific example, the laser drill can be an 11 W high power diode-pumped UV laser, or the like. This mask 122 can be subsequently removed before proceeding to other steps. The mask may also be omitted from the laser drilling process, and air flow can be used to remove laser debris.

FIG. 4C can represent a method step of using a dry etching process to form the topside micro-trench 121 in the piezoelectric layer 120. As shown, a lithographic masking layer 123 can be forming overlying the piezoelectric layer 120 and the topside metal electrode 130. The topside micro-trench 121 can be formed by exposure to plasma, or the like.

FIGS. 4D and 4E are simplified diagrams illustrating an alternative method for conducting the method step as described in FIG. 4A. These figures can represent the method step of manufacturing multiple acoustic resonator devices simultaneously. In FIG. 4D, two devices are shown on Die #1 and Die #2, respectively. FIG. 4E shows the process of forming a micro-via 121 on each of these dies while also etching a scribe line 124 or dicing line. In an example, the etching of the scribe line 124 singulates and relieves stress in the piezoelectric single crystal layer 120.

Figure 5:
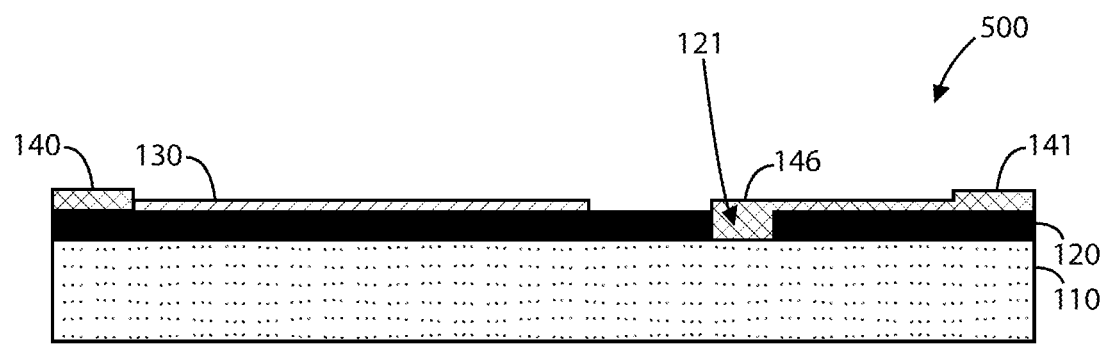
FIGS. 5 to 8 are simplified diagrams illustrating steps for a method of manufacture for an acoustic resonator device according to an example of the present invention.

FIGS. 5 to 8 are simplified diagrams illustrating steps for a method of manufacture for an acoustic resonator device according to an example of the present invention. FIG. 5 can represent the method step of forming one or more bond pads 140 and forming a topside metal 141 electrically coupled to at least one of the bond pads 140. The topside metal 141 can include a topside metal plug 146 formed within the topside micro-trench 121. In a specific example, the topside metal plug 146 fills the topside micro-trench 121 to form a topside portion of a micro-via.

In an example, the bond pads 140 and the topside metal 141 can include a gold material or other interconnect metal material depending upon the application of the device. These metal materials can be formed by a lift-off process, a wet etching process, a dry etching process, a screen-printing process, an electroplating process, a metal printing process, or the like. In a specific example, the deposited metal materials can also serve as bond pads for a cap structure, which will be described below.

Figure 6:
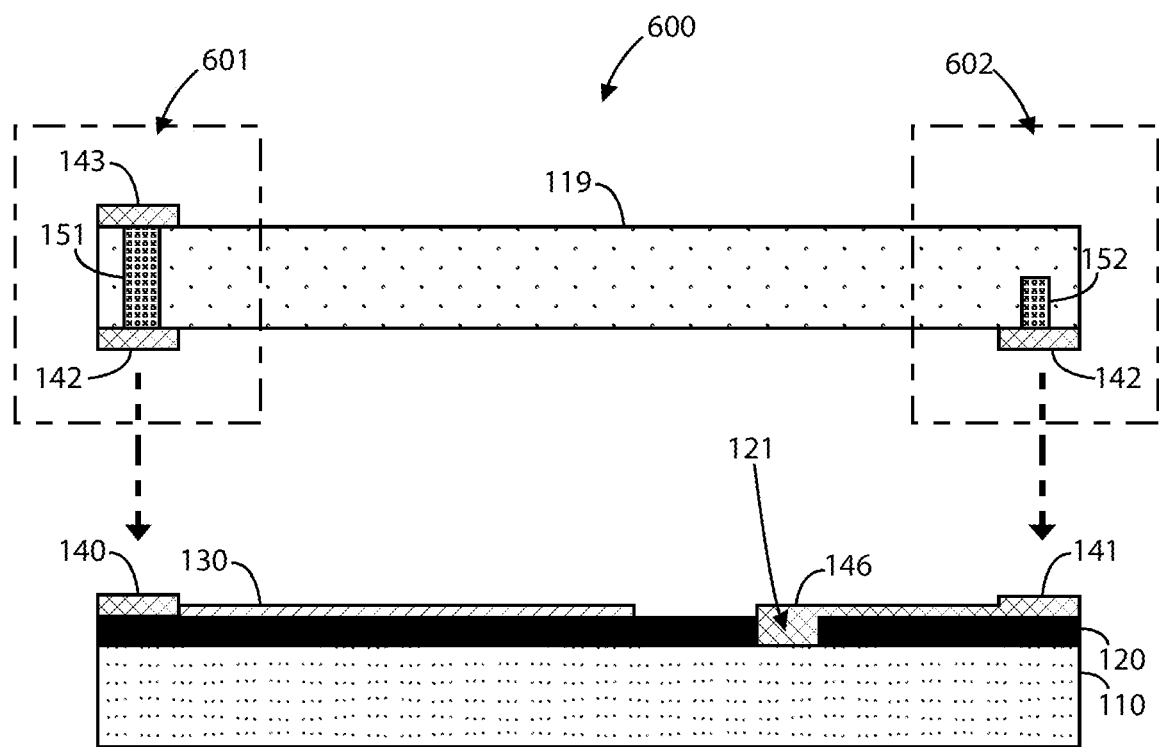

FIG. 6 can represent a method step for preparing the acoustic resonator device for bonding, which can be a hermetic bonding. As shown, a top cap structure is positioned above the partially processed acoustic resonator device as described in the previous figures. The top cap structure can be formed using an interposer substrate 119 in two configurations: fully processed interposer version 601 (through glass via) and partially processed interposer version 602 (blind via version). In the 601 version, the interposer substrate 119 includes through-via structures 151 that extend through the interposer substrate 119 and are electrically coupled to bottom bond pads 142 and top bond pads 143. In the 602 version, the interposer substrate 119 includes blind via structures 152 that only extend through a portion of the interposer substrate 119 from the bottom side. These blind via structures 152 are also electrically coupled to bottom bond pads 142. In a specific example, the interposer substrate can include a silicon, glass, smart-glass, or other like material.

Figure 7:
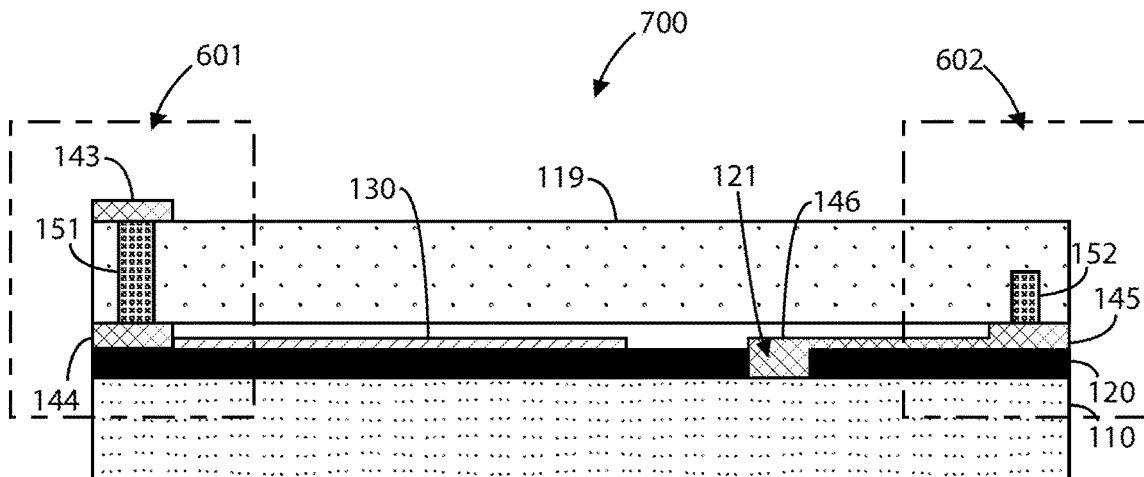
Figure 8:
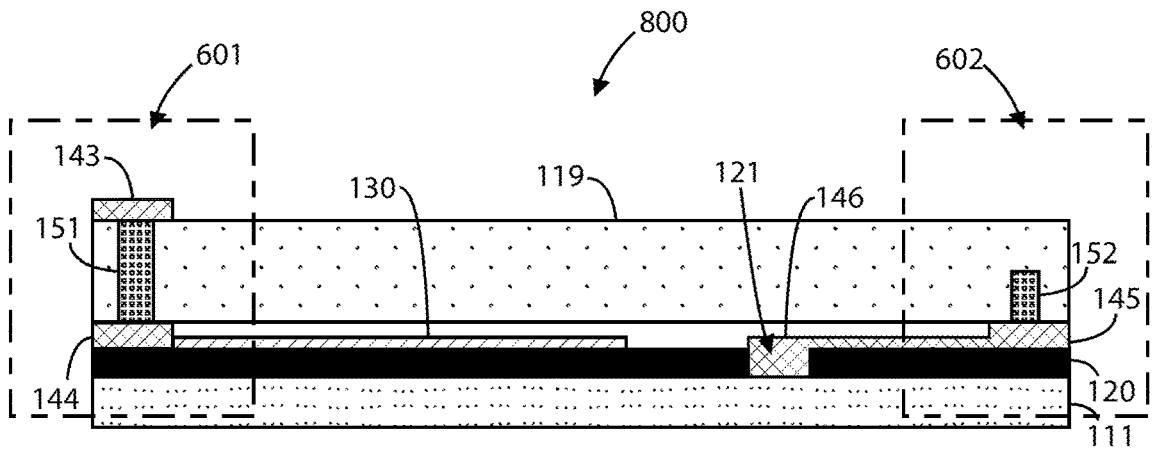

FIG. 7 can represent a method step of bonding the top cap structure to the partially processed acoustic resonator device. As shown, the interposer substrate 119 is bonded to the piezoelectric layer by the bond pads (140, 142) and the topside metal 141, which are now denoted as bond pad 144 and topside metal 145. This bonding process can be done using a compression bond method or the like. FIG. 8 can represent a method step of thinning the seed substrate 110, which is now denoted as thinned seed substrate 111. This substrate thinning process can include grinding and etching processes or the like. In a specific example, this process can include a wafer backgrinding process followed by stress removal, which can involve dry etching, CMP polishing, or annealing processes.

Figure 9A:
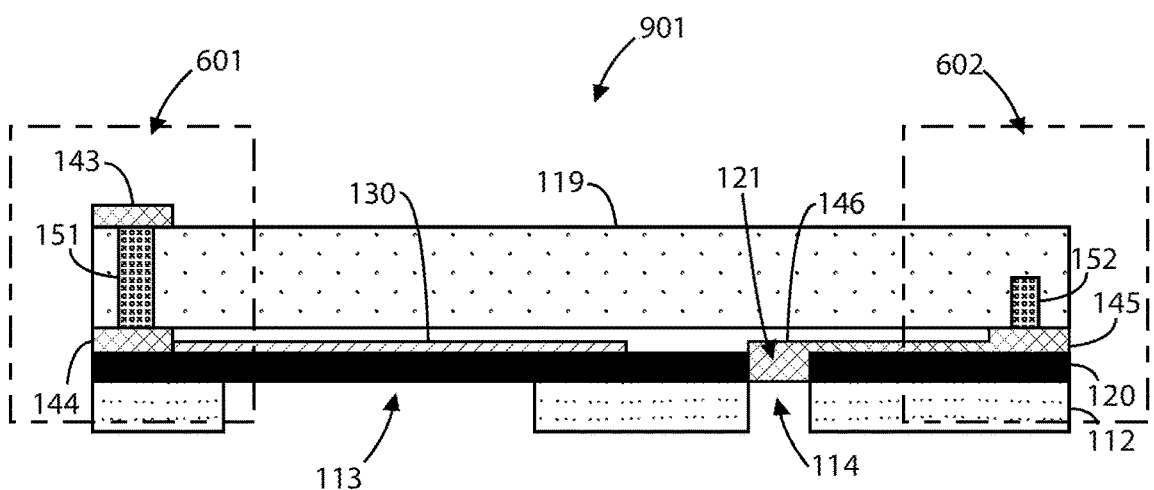
FIG. 9A is a simplified diagram illustrating a method step for forming backside trenches according to an example of the present invention.

FIG. 9A is a simplified diagram illustrating a step for a method of manufacture for an acoustic resonator device 901 according to an example of the present invention. FIG. 9A can represent a method step for forming backside trenches 113 and 114 to allow access to the piezoelectric layer from the backside of the thinned seed substrate 111. In an example, the first backside trench 113 can be formed within the thinned seed substrate 111 and underlying the topside metal electrode 130. The second backside trench 114 can be formed within the thinned seed substrate 111 and underlying the topside micro-trench 121 and topside metal plug 146. This substrate is now denoted thinned substrate 112. In a specific example, these trenches 113 and 114 can be formed using deep reactive ion etching (DRIE) processes, Bosch processes, or the like. The size, shape, and number of the trenches may vary with the design of the acoustic resonator device. In various examples, the first backside trench may be formed with a trench shape similar to a shape of the topside metal electrode or a shape of the backside metal electrode. The first backside trench may also be formed with a trench shape that is different from both a shape of the topside metal electrode and the backside metal electrode.

FIGS. 9B and 9C are simplified diagrams illustrating an alternative method for conducting the method step as described in FIG. 9A. Like FIGS. 4D and 4E, these figures can represent the method step of manufacturing multiple acoustic resonator devices simultaneously. In FIG. 9B, two devices with cap structures are shown on Die #1 and Die #2, respectively. FIG. 9C shows the process of forming backside trenches (113, 114) on each of these dies while also etching a scribe line 115 or dicing line. In an example, the etching of the scribe line 115 provides an optional way to singulate the backside wafer 112.

Figure 10:
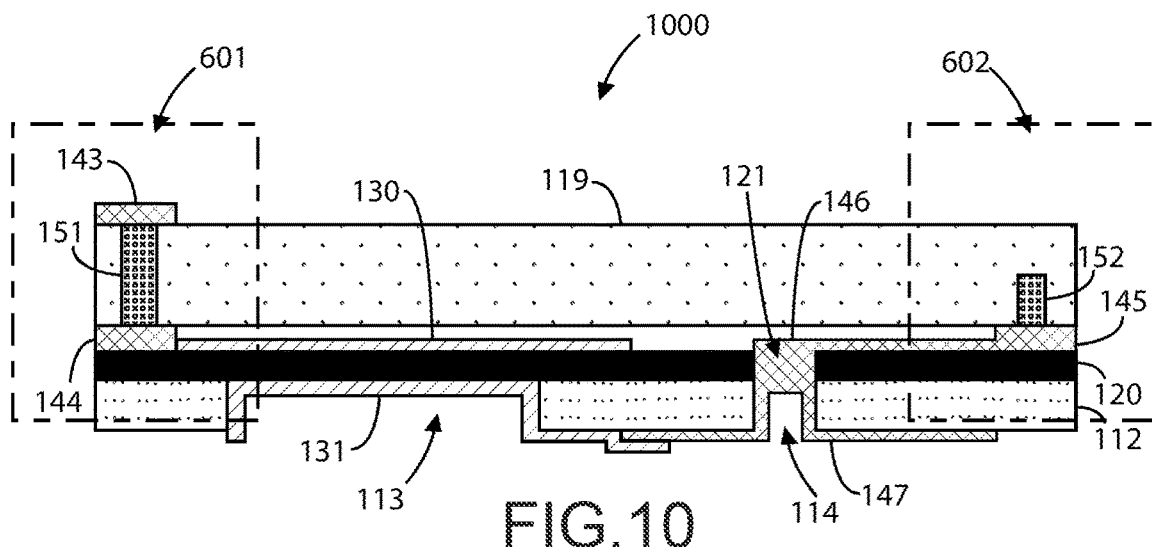
FIG. 10 is a simplified diagram illustrating a method step forming backside metallization and electrical interconnections between top and bottom sides of a resonator according to an example of the present invention.

FIG. 10 is a simplified diagram illustrating a step for a method of manufacture for an acoustic resonator device 1000 according to an example of the present invention. This figure can represent a method step of forming a backside metal electrode 131 and a backside metal plug 147 within the backside trenches of the thinned seed substrate 112. In an example, the backside metal electrode 131 can be formed underlying one or more portions of the thinned substrate 112, within the first backside trench 113, and underlying the topside metal electrode 130. This process completes the resonator structure within the acoustic resonator device. The backside metal plug 147 can be formed underlying one or more portions of the thinned substrate 112, within the second backside trench 114, and underlying the topside micro-trench 121. The backside metal plug 147 can be electrically coupled to the topside metal plug 146 and the backside metal electrode 131. In a specific example, the backside metal electrode 130 can include a molybdenum, aluminum, ruthenium, or titanium material, or the like and combinations thereof. The backside metal plug can include a gold material, low resistivity interconnect metals, electrode metals, or the like. These layers can be deposited using the deposition methods described previously.

Figure 11A:
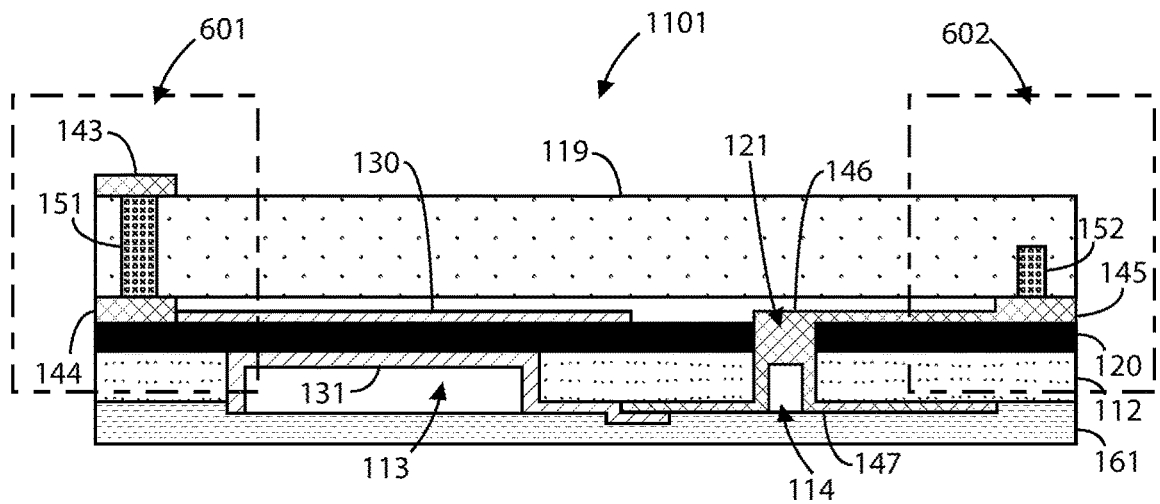
FIGS. 11A and 11B are simplified diagrams illustrating alternative steps for a method of manufacture for an acoustic resonator device according to an example of the present invention.
Figure 11B:
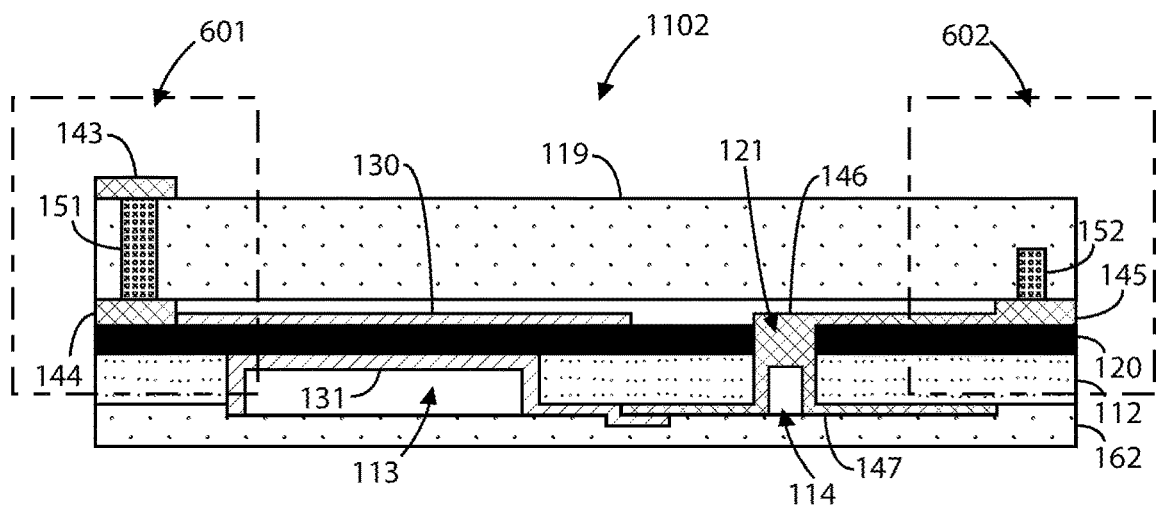

FIGS. 11A and 11B are simplified diagrams illustrating alternative steps for a method of manufacture for an acoustic resonator device according to an example of the present invention. These figures show methods of bonding a backside cap structure underlying the thinned seed substrate 112. In FIG. 11A, the backside cap structure is a dry film cap 161, which can include a permanent photo-imageable dry film such as a solder mask, polyimide, or the like. Bonding this cap structure can be cost-effective and reliable, but may not produce a hermetic seal. In FIG. 11B, the backside cap structure is a substrate 162, which can include a silicon, glass, or other like material. Bonding this substrate can provide a hermetic seal, but may cost more and require additional processes. Depending upon application, either of these backside cap structures can be bonded underlying the first and second backside vias.

Figure 12A:
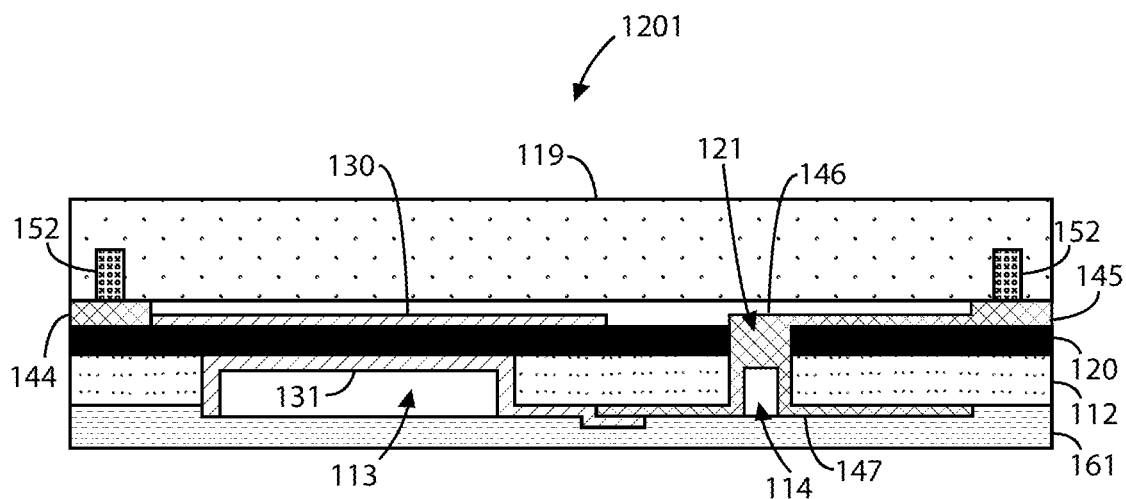
FIGS. 12A to 12E are simplified diagrams illustrating steps for a method of manufacture for an acoustic resonator device using a blind via interposer according to an example of the present invention.
Figure 12B:
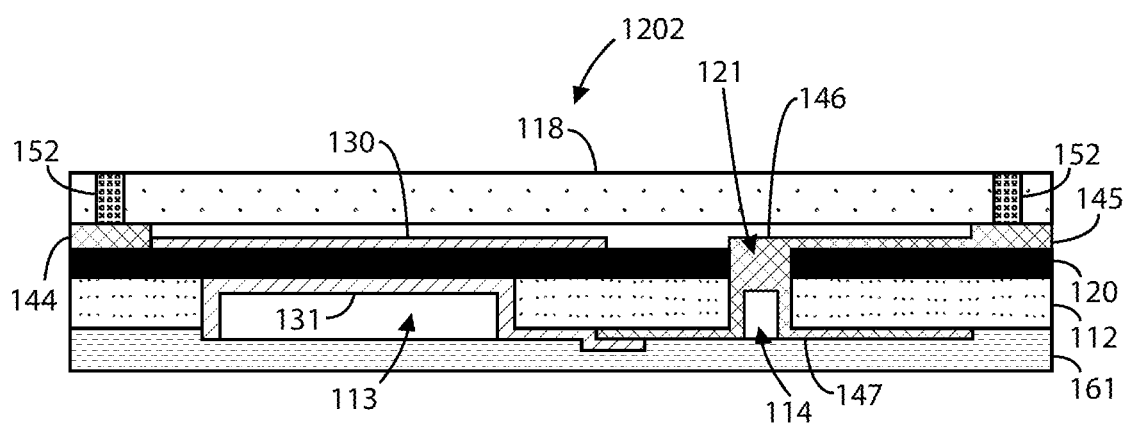
Figure 12C:
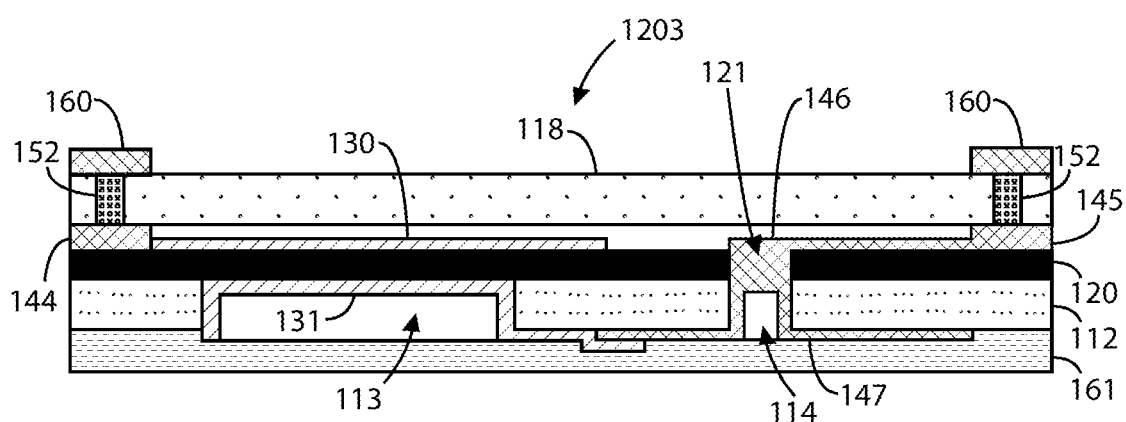
Figure 12D:
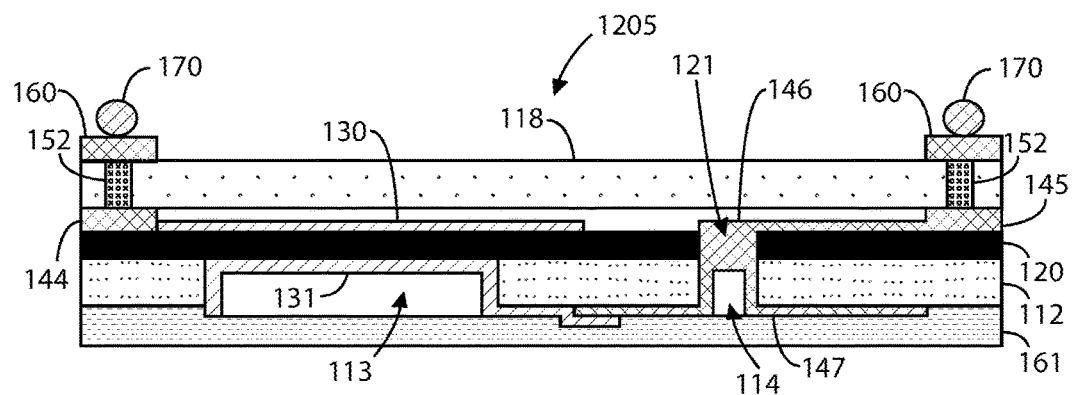
Figure 12E:
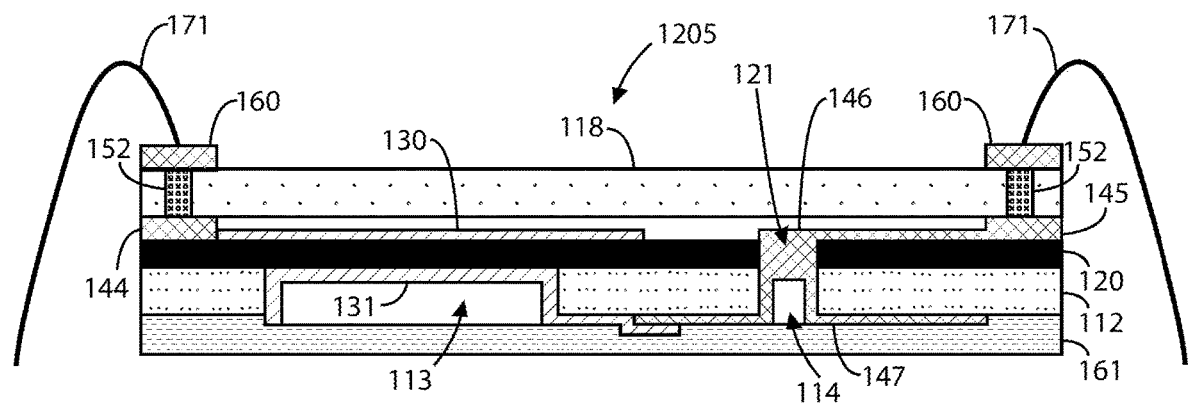

FIGS. 12A to 12E are simplified diagrams illustrating steps for a method of manufacture for an acoustic resonator device according to an example of the present invention. More specifically, these figures describe additional steps for processing the blind via interposer "602" version of the top cap structure. FIG. 12A shows an acoustic resonator device 1201 with blind vias 152 in the top cap structure. In FIG. 12B, the interposer substrate 119 is thinned, which forms a thinned interposer substrate 118, to expose the blind vias 152. This thinning process can be a combination of a grinding process and etching process as described for the thinning of the seed substrate. In FIG. 12C, a redistribution layer (RDL) process and metallization process can be applied to create top cap bond pads 160 that are formed overlying the blind vias 152 and are electrically coupled to the blind vias 152. As shown in FIG. 12D, a ball grid array (BGA) process can be applied to form solder balls 170 overlying and electrically coupled to the top cap bond pads 160. This process leaves the acoustic resonator device ready for wire bonding 171, as shown in FIG. 12E.

Figure 13:
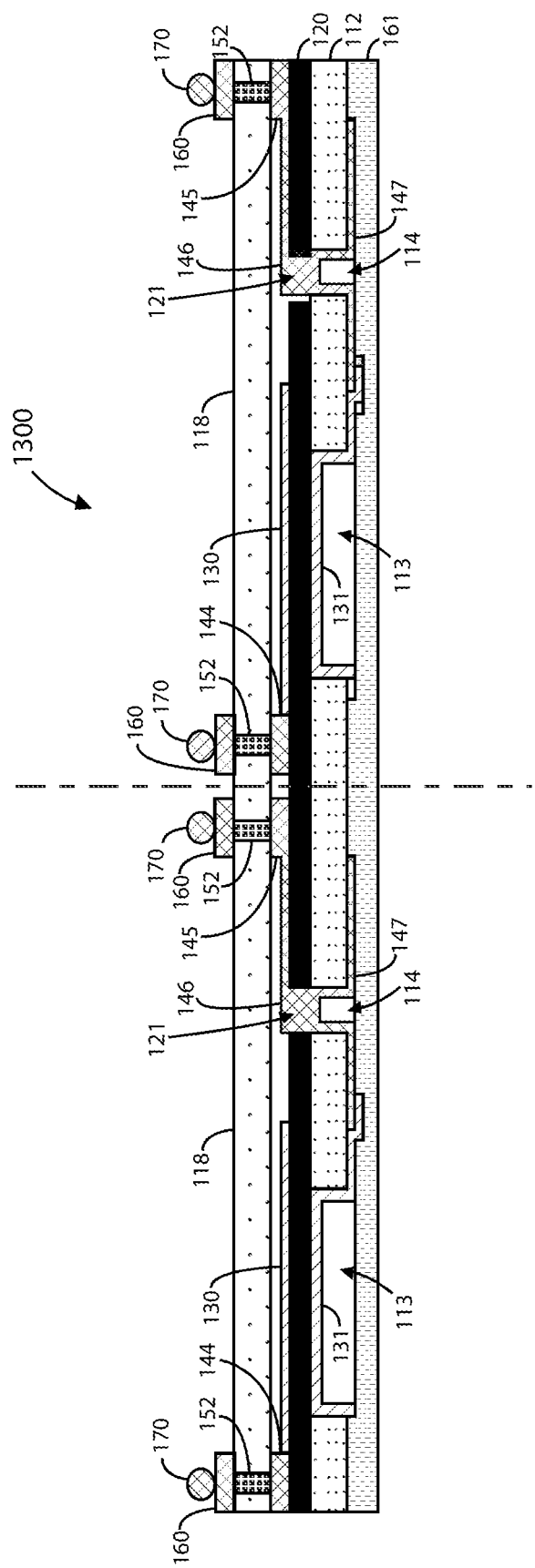
FIG. 13 is a simplified diagram illustrating a step for a method of manufacture for an acoustic resonator device according to an example of the present invention.

FIG. 13 is a simplified diagram illustrating a step for a method of manufacture for an acoustic resonator device according to an example of the present invention. As shown, device 1300 includes two fully processed acoustic resonator devices that are ready to singulation to create separate devices. In an example, the die singulation process can be done using a wafer dicing saw process, a laser cut singulation process, or other processes and combinations thereof.

Figure 14A:
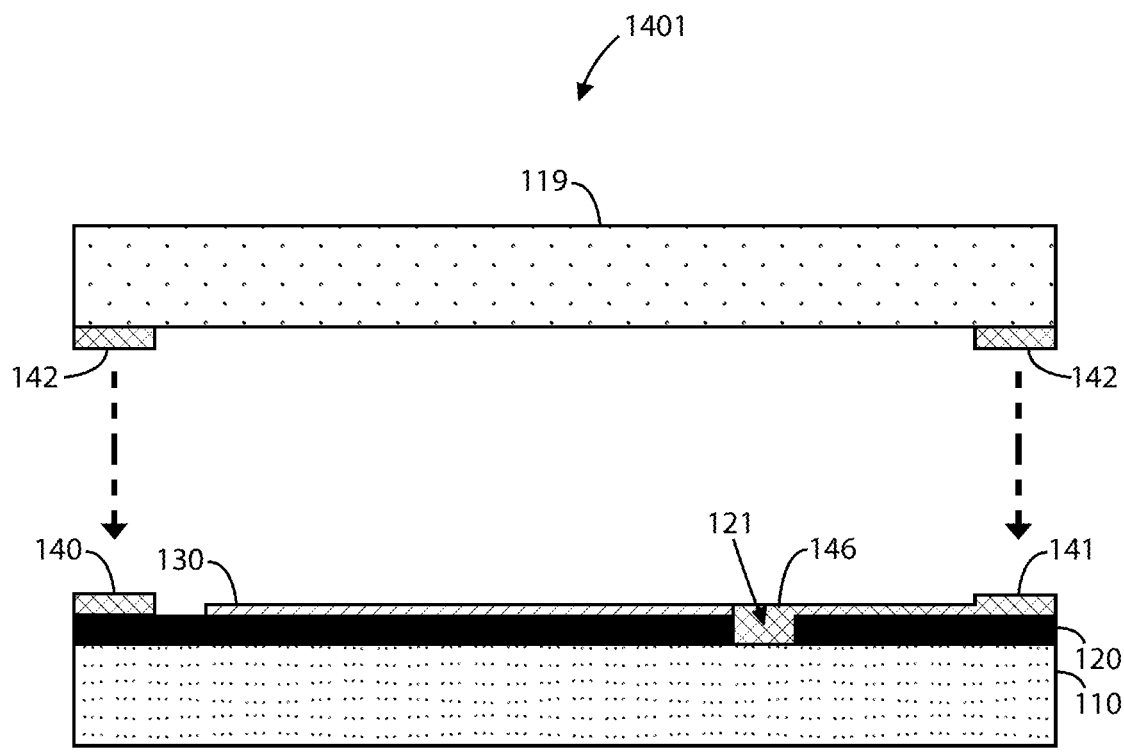
FIGS. 14A to 14G are simplified diagrams illustrating method steps for a cap wafer process for an acoustic resonator device according to an example of the present invention.

FIGS. 14A to 14G are simplified diagrams illustrating steps for a method of manufacture for an acoustic resonator device according to an example of the present invention. This method illustrates the process for fabricating an acoustic resonator device similar to that shown in FIG. 1B. The method for this example of an acoustic resonator can go through similar steps as described in FIGS. 1-5. FIG. 14A shows where this method differs from that described previously. Here, the top cap structure substrate 119 and only includes one layer of metallization with one or more bottom bond pads 142. Compared to FIG. 6, there are no via structures in the top cap structure because the interconnections will be formed on the bottom side of the acoustic resonator device.

Figure 14B:
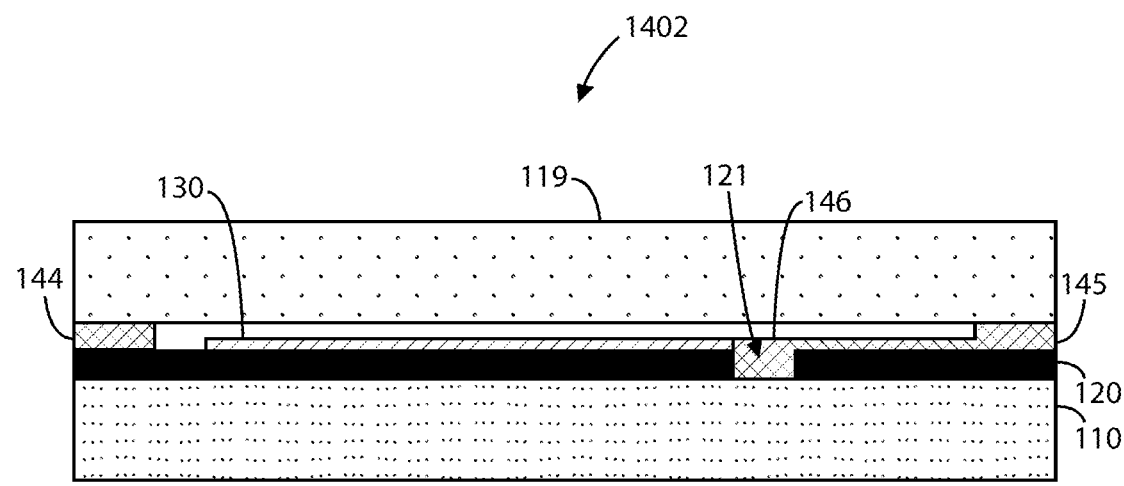
Figure 14C:
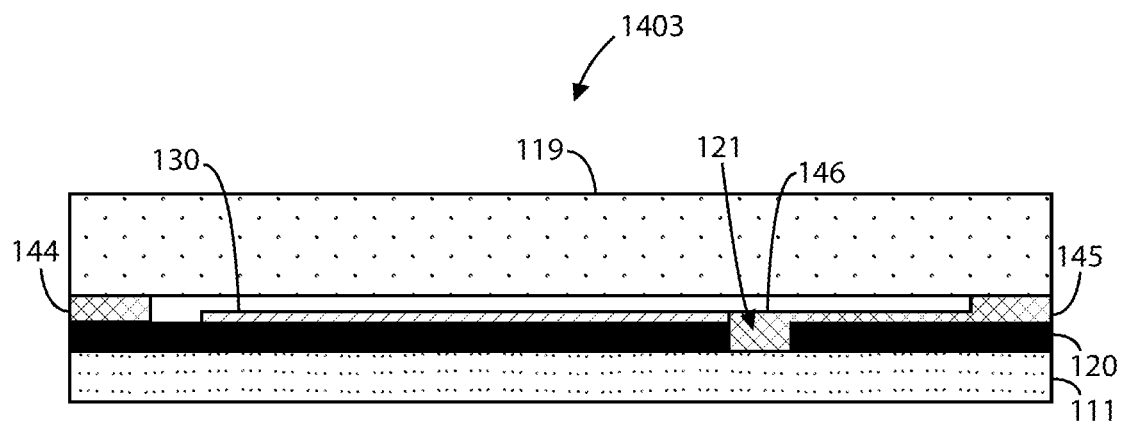
Figure 14D:
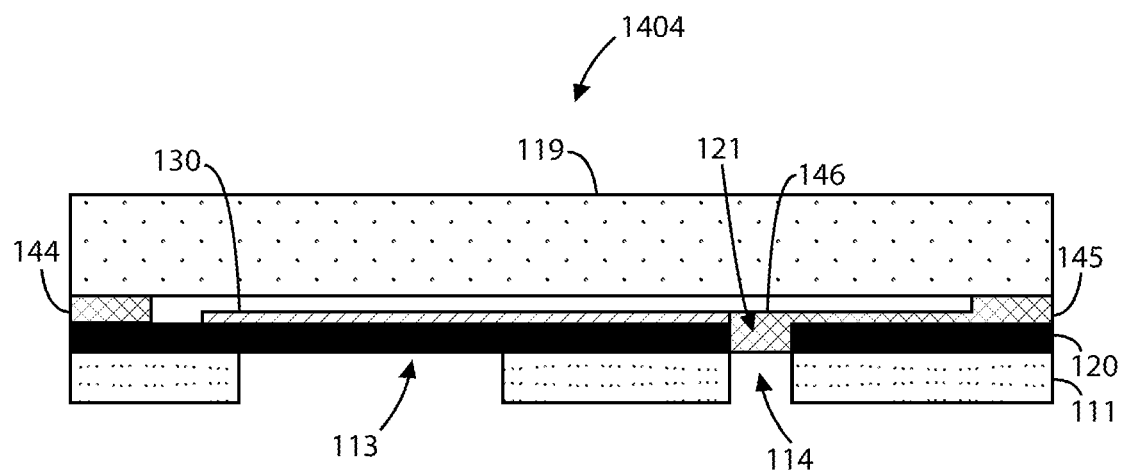
Figure 14E:
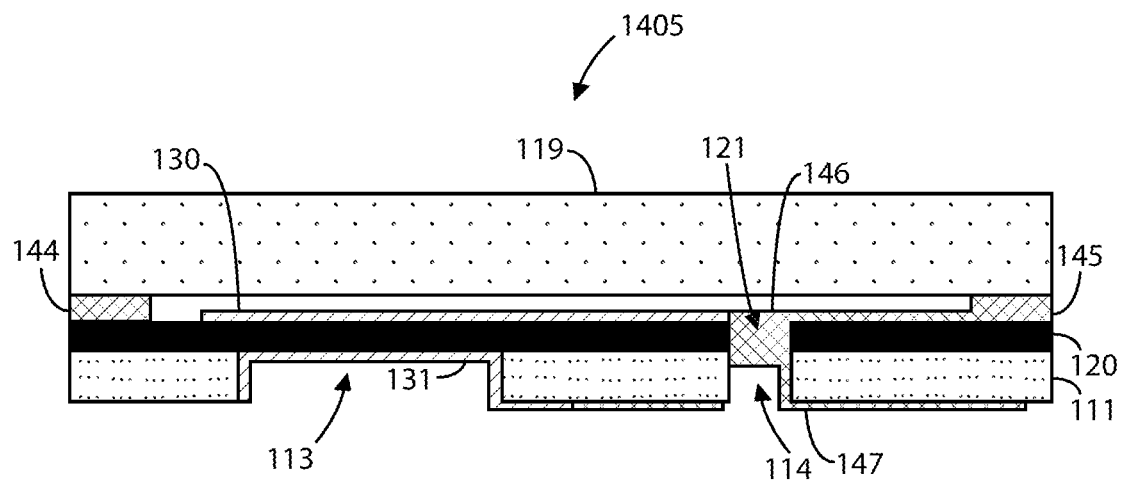
Figure 14F:
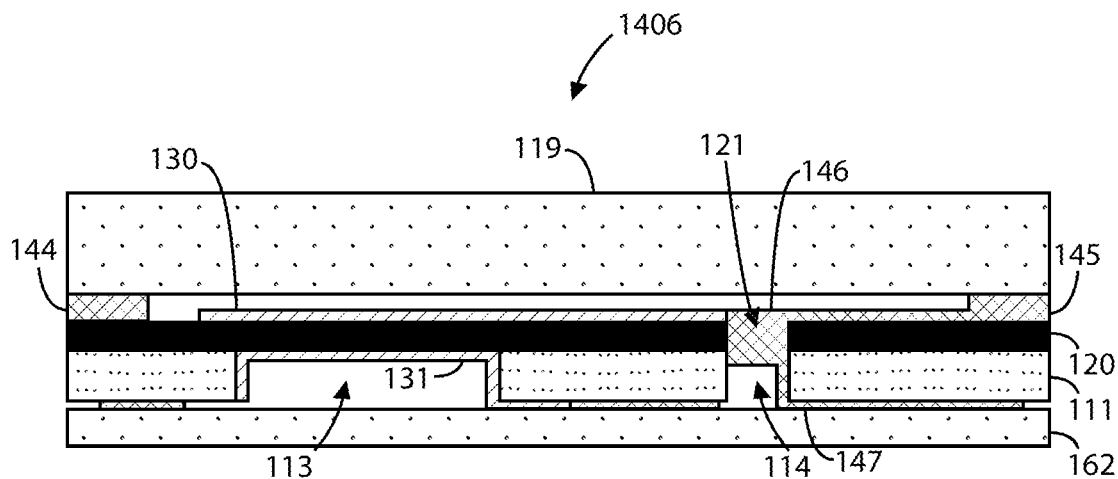

FIGS. 14B to 14F depict method steps similar to those described in the first process flow. FIG. 14B can represent a method step of bonding the top cap structure to the piezoelectric layer 120 through the bond pads (140, 142) and the topside metal 141, now denoted as bond pads 144 and topside metal 145 with topside metal plug 146. FIG. 14C can represent a method step of thinning the seed substrate 110, which forms a thinned seed substrate 111, similar to that described in FIG. 8. FIG. 14D can represent a method step of forming first and second backside trenches, similar to that described in FIG. 9A. FIG. 14E can represent a method step of forming a backside metal electrode 131 and a backside metal plug 147, similar to that described in FIG. 10. FIG. 14F can represent a method step of bonding a backside cap structure 162, similar to that described in FIGS. 11A and 11B.

Figure 14G:
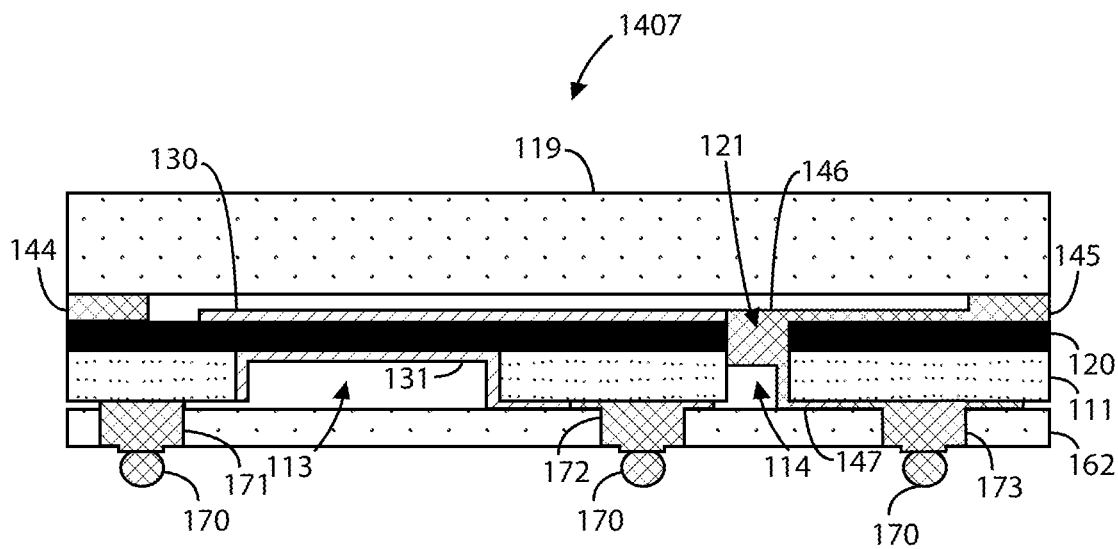

FIG. 14G shows another step that differs from the previously described process flow. Here, the backside bond pads 171, 172, and 173 are formed within the backside cap structure 162. In an example, these backside bond pads 171-173 can be formed through a masking, etching, and metal deposition processes similar to those used to form the other metal materials. A BGA process can be applied to form solder balls 170 in contact with these backside bond pads 171-173, which prepares the acoustic resonator device 1407 for wire bonding.

Figure 15A:
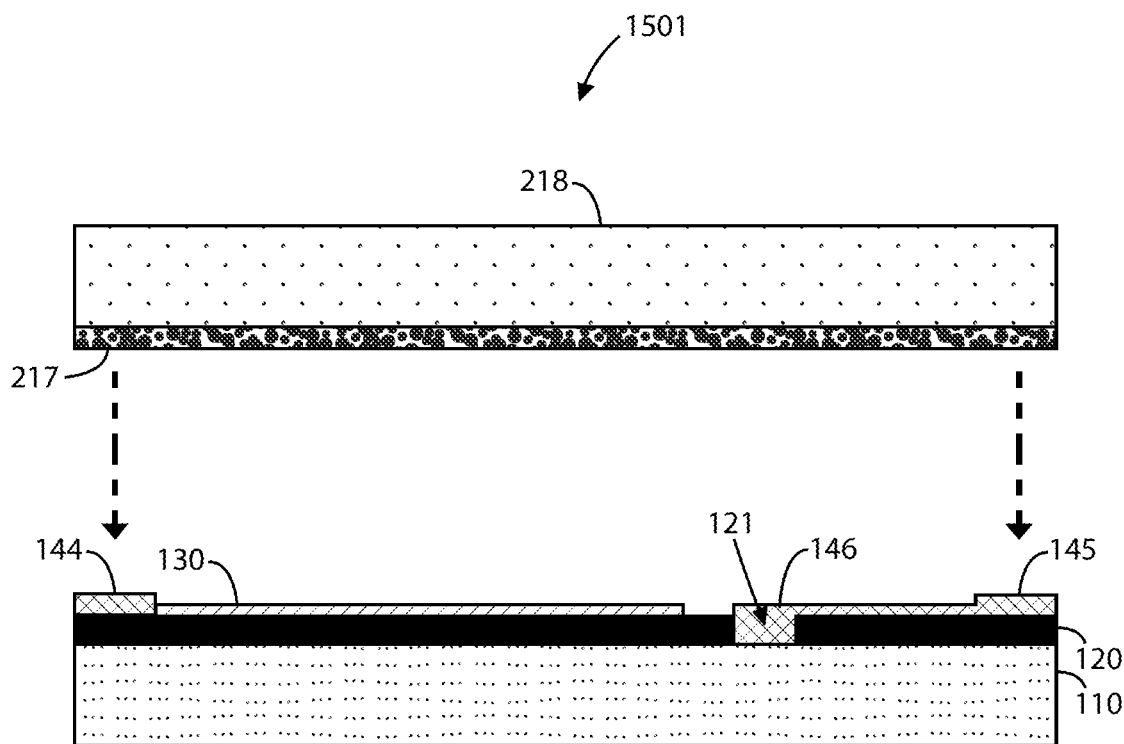
FIGS. 15A-15E are simplified diagrams illustrating method steps for making an acoustic resonator device with shared backside trench, which can be implemented in both interposer/cap and interposer free versions, according to examples of the present invention.

FIGS. 15A to 15E are simplified diagrams illustrating steps for a method of manufacture for an acoustic resonator device according to an example of the present invention. This method illustrates the process for fabricating an acoustic resonator device similar to that shown in FIG. 1B. The method for this example can go through similar steps as described in FIG. 1-5. FIG. 15A shows where this method differs from that described previously. A temporary carrier 218 with a layer of temporary adhesive 217 is attached to the substrate. In a specific example, the temporary carrier 218 can include a glass wafer, a silicon wafer, or other wafer and the like.

Figure 15B:
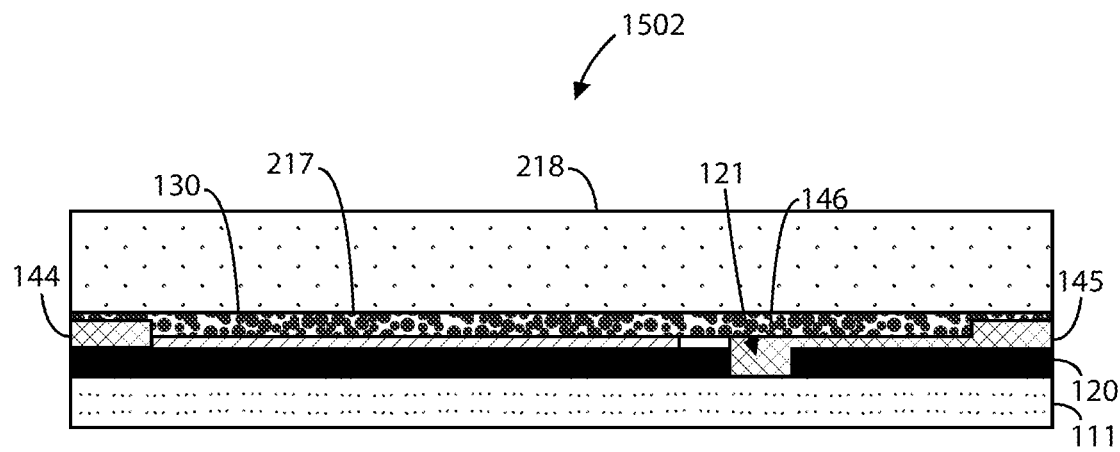

FIGS. 15B to 15F depict method steps similar to those described in the first process flow. FIG. 15B can represent a method step of thinning the seed substrate 110, which forms a thinned substrate 111, similar to that described in FIG. 8. In a specific example, the thinning of the seed substrate 110 can include a back side grinding process followed by a stress removal process. The stress removal process can include a dry etch, a Chemical Mechanical Planarization (CMP), and annealing processes.

Figure 15C:
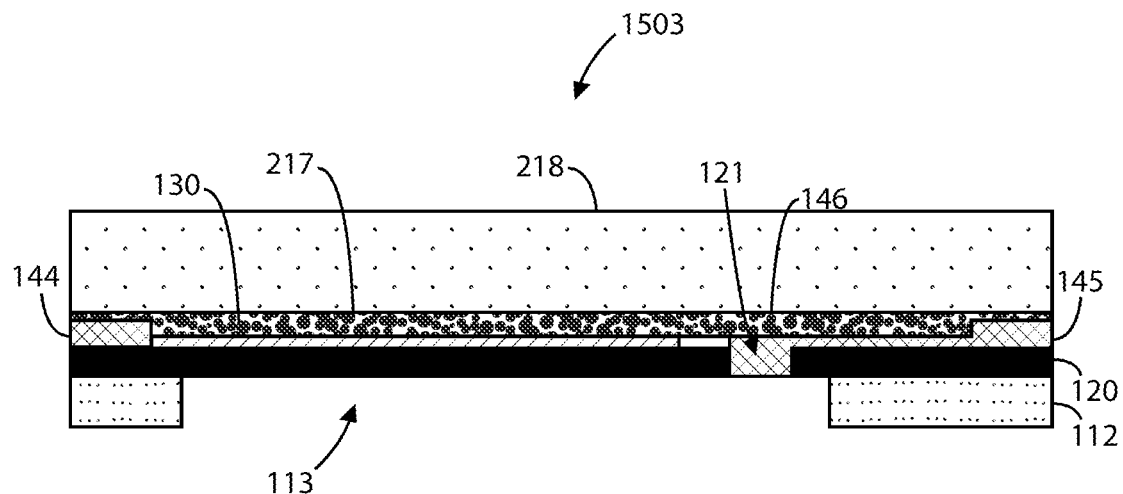
Figure 15D:
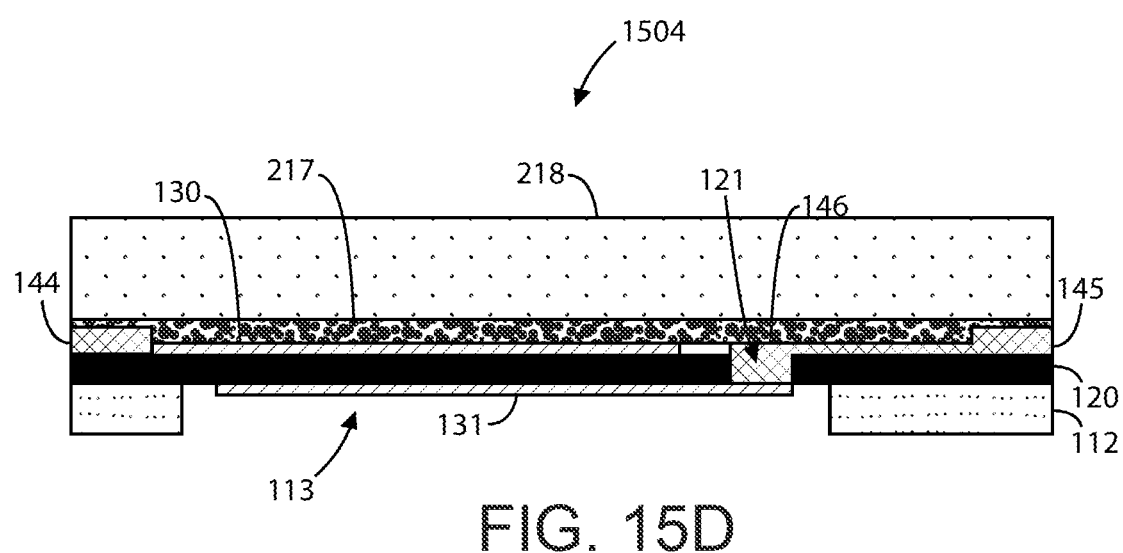

FIG. 15C can represent a method step of forming a shared backside trench 113, similar to the techniques described in FIG. 9A. The main difference is that the shared backside trench is configured underlying both topside metal electrode 130, topside micro-trench 121, and topside metal plug 146. In an example, the shared backside trench 113 is a backside resonator cavity that can vary in size, shape (all possible geometric shapes), and side wall profile (tapered convex, tapered concave, or right angle). In a specific example, the forming of the shared backside trench 113 can include a litho-etch process, which can include a back-to-front alignment and dry etch of the backside substrate 111. The piezoelectric layer 120 can serve as an etch stop layer for the forming of the shared backside trench 113. FIG. 15D can represent a method step of forming a backside metal electrode 131 and a backside metal 147, similar to that described in FIG. 10. In an example, the forming of the backside metal electrode 131 can include a deposition and patterning of metal materials within the shared backside trench 113. Here, the backside metal 131 serves as an electrode and the backside plug/connect metal 147 within the micro-via 121. The thickness, shape, and type of metal can vary as a function of the resonator/filter design. As an example, the backside electrode 131 and via plug metal 147 can be different metals. In a specific example, these backside metals 131, 147 can either be deposited and patterned on the surface of the piezoelectric layer 120 or rerouted to the backside of the substrate 112. In an example, the backside metal electrode may be patterned such that it is configured within the boundaries of the shared backside trench such that the backside metal electrode does not come in contact with one or more side-walls of the seed substrate created during the forming of the shared backside trench.

Figure 15E:
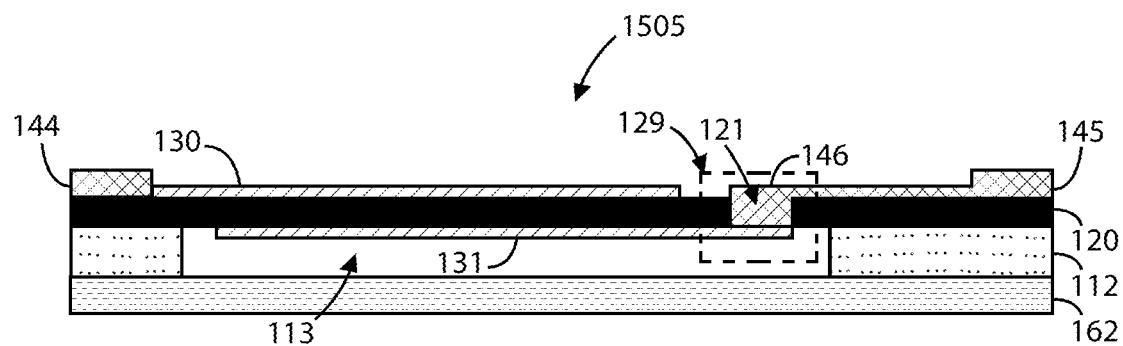

FIG. 15E can represent a method step of bonding a backside cap structure 162, similar to that described in FIGS. 11A and 11B, following a de-bonding of the temporary carrier 218 and cleaning of the topside of the device to remove the temporary adhesive 217. Those of ordinary skill in the art will recognize other variations, modifications, and alternatives of the methods steps described previously.

One or more benefits are achieved over pre-existing techniques using the invention. In particular, the present device can be manufactured in a relatively simple and cost effective manner while using conventional materials and/or methods according to one of ordinary skill in the art. Using the present method, one can create a reliable single crystal based acoustic resonator using multiple ways of three-dimensional stacking through a wafer level process. Such filters or resonators can be implemented in an RF filter device, an RF filter system, or the like. Depending upon the embodiment, one or more of these benefits may be achieved. Of course, there can be other variations, modifications, and alternatives.

While the above is a full description of the specific embodiments, various modifications, alternative constructions and equivalents may be used. As an example, the packaged device can include any combination of elements described above, as well as outside of the present specification. As used herein, the term "substrate" can mean the bulk substrate or can include overlying growth structures such as an aluminum, gallium, or ternary compound of aluminum and gallium and nitrogen containing epitaxial region, or functional regions, combinations, and the like. Therefore, the above description and illustrations should not be taken as limiting the scope of the present invention which is defined by the appended claims.

What is claimed is:

1. A method for fabricating an acoustic resonator device, the method comprising:
providing a piezoelectric substrate having a piezoelectric layer formed overlying a seed substrate and a substrate surface region as a top surface of the piezoelectric layer;
forming a topside metal electrode overlying a portion of the substrate surface region;
forming a topside micro-trench within a portion of the piezoelectric layer different from the portion where the topside metal electrode is formed that extends through the piezoelectric layer;
forming one or more bond pads overlying one or more portions of the piezoelectric layer different from the one or more portions where the topside metal electrode and the topside micro-trench are formed;
forming a topside metal having a topside metal plug within the topside micro-trench and electrically coupled to at least one of the bond pads;
providing a top cap structure, the top cap structure including a substrate with one or more bottom bond pads;
bonding the top cap structure to the piezoelectric substrate, the one or more bottom bond pads being electrically coupled to the one or more bond pads and the topside metal;
thinning the seed substrate to form a thinned seed substrate;
forming a first backside trench within the thinned seed substrate and underlying the topside metal electrode;
forming a second backside trench within the thinned seed substrate and underlying the topside micro-trench;
forming a backside metal electrode underlying one or more portions of the thinned seed substrate, within the first backside trench, and underlying the topside metal electrode;
forming a backside metal plug underlying one or more portions of the thinned seed substrate, within the second backside trench, and underlying the topside micro-trench, the backside metal plug being electrically coupled to the topside metal plug, wherein the topside micro-trench, the topside metal plug, the second backside trench, and the backside metal plug form a micro-via that extends through the piezoelectric substrate;
bonding a backside cap structure to the thinned seed substrate, the backside cap structure underlying the first and second backside trenches;
forming one or more backside bond pads within one or more portions of the backside cap structure, the one or more of the backside bond pads being electrically coupled to the backside metal plug; and
forming one or more solder balls underlying the one or more backside bond pads.

2. The method of claim 1 wherein the seed substrate includes silicon, silicon carbide, aluminum oxide, or single crystal aluminum gallium nitride materials.

3. The method of claim 1 wherein the topside and backside metal electrodes include molybdenum, aluminum, ruthenium, or titanium materials, or combinations thereof; and wherein the topside metal, the topside metal plug, and the backside metal plug include gold materials or other metals.

4. The method of claim 1 wherein forming the topside metal electrode, backside metal electrode, topside metal, and backside metal plug includes a lift-off process, a wet etching process, a dry etching process, a metal printing process, or a metal laminating process.

5. The method of claim 1 wherein forming the topside micro-trench includes a laser drilling process or an etching process.

6. The method of claim 1 wherein the backside cap structure includes a solder mask, a polyimide, a silicone, or a glass material.

7. The method of claim 1 further comprising
forming a first scribe line within the piezoelectric layer during the forming of the topside micro-trench, and
forming a second scribe line within the thinned silicon substrate during the forming of the first and second backside trenches.

8. The method of claim 7 wherein a plurality of acoustic resonator devices are formed one a single wafer and further comprising singulating the single wafer along the first and second scribe lines to form a plurality of singulated acoustic resonator devices.

9. The device of claim 1 wherein the backside cap structure includes a solder mask, a polyimide, a silicone, or a glass material.

10. The method of claim 1 further comprising
forming a first scribe line within the piezoelectric layer during the forming of the topside micro-trench, and
forming a second scribe line within the thinned silicon substrate during the forming of the first and second backside trenches.

11. The method of claim 10 wherein a plurality of acoustic resonator devices are formed one a single wafer and further comprising singulating the single wafer along the first and second scribe lines to form a plurality of singulated acoustic resonator devices.

12. A method for fabricating an acoustic resonator device, the method comprising:

provaling a piezoelectric substrate having a piezoelectric layer formed overlying a seed substrate and a substrate surface region as a top surface of the piezoelectric layer;

forming a topside metal electrode overlying a portion of the substrate surface region; forming a topside micro-trench within a portion of the piezoelectric layer different from the portion where the topside metal electrode is formed that extends through the piezoelectric layer;

forming one or more bond pads overlying one or more portions of the piezoelectric layer different from the one or more portions where the topside metal electrode and the topside micro-trench are formed;

forming a topside metal having a topside metal plug within the topside micro-trench and electrically coupled to at least one of the bond pads;

providing a top cap structure, the top cap structure including a substrate with one or more bottom bond pads;

bonding the top cap structure to the piezoelectric substrate, the one or more bottom bond pads being electrically coupled to the one or more bond pads and the topside metal;

thinning the seed substrate to form a thinned seed substrate;

forming a first backside trench within the thinned seed substrate and underlying the topside metal electrode;

forming a second backside trench within the thinned seed substrate and underlying the topside micro-trench;

forming a backside metal electrode underlying one or more portions of the thinned seed substrate, within the first backside trench, and underlying the topside metal electrode;

forming a backside metal plug underlying one or more portions of the thinned seed substrate, within the second backside trench, and underlying the topside micro-trench, the backside metal plug being electrically coupled to the topside metal plug, wherein the topside micro-trench, the topside metal plug, the second backside trench, and the backside metal plug form a micro-via that extends through the piezoelectric substrate;

bonding a backside cap structure to the thinned seed substrate, the backside cap structure underlying the first and second backside trenches; and forming one or more backside bond pads electrically coupled to the backside metal plug.

13. The method of claim 12 wherein the seed substrate includes silicon, silicon carbide, aluminum oxide, or single crystal aluminum gallium nitride materials.

14. The method of claim 12 wherein the topside and backside metal electrodes include molybdenum, aluminum, ruthenium, or titanium materials, or combinations thereof; and wherein the topside metal, the topside metal plug, and the backside metal plug include gold materials or other metals.

15. The method of claim 12 wherein forming the topside metal electrode, backside metal electrode, topside metal, and backside metal plug includes a lift-off process, a wet etching process, a dry etching process, a metal printing process, or a metal laminating process.

16. The method of claim 12 wherein forming the topside micro-trench includes a laser drilling process or an etching process.

17. The method of claim 12 wherein the backside cap structure includes a solder mask, a polyimide, a silicone, or a glass material.

* * * * *